United States Patent
Lee et al.

(10) Patent No.: US 11,469,513 B2
(45) Date of Patent: Oct. 11, 2022

(54) PROXIMITY SENSOR USING A LEAKY COAXIAL CABLE

(71) Applicant: Ohio State Innovation Foundation, Columbus, OH (US)

(72) Inventors: Robert Lee, Hilliard, OH (US); Zhenyu Wang, Columbus, OH (US); Asimina Kiourti, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 21 days.

(21) Appl. No.: 16/912,982

(22) Filed: Jun. 26, 2020

(65) Prior Publication Data
US 2020/0412003 A1 Dec. 31, 2020

Related U.S. Application Data

(60) Provisional application No. 62/866,694, filed on Jun. 26, 2019.

(51) Int. Cl.
| | | |
|---|---|---|
| *H01Q 13/20* | (2006.01) |
| *H04B 5/00* | (2006.01) |
| *H03K 17/945* | (2006.01) |
| *B62D 1/04* | (2006.01) |
| *H01B 11/18* | (2006.01) |

(52) U.S. Cl.
CPC ............ *H01Q 13/203* (2013.01); *B62D 1/04* (2013.01); *H01B 11/1808* (2013.01); *H03K 17/945* (2013.01); *H04B 5/0018* (2013.01)

(58) Field of Classification Search
None
See application file for complete search history.

(56) References Cited

U.S. PATENT DOCUMENTS

| | | | | |
|---|---|---|---|---|
| 5,717,411 A * | 2/1998 | Knop | ............. | H01Q 13/22 333/237 |
| 5,809,429 A * | 9/1998 | Knop | ............. | H04B 5/02 455/523 |
| 6,310,705 B1 * | 10/2001 | Lee | ............. | H04B 1/18 398/126 |
| 6,480,163 B1 * | 11/2002 | Knop | ............. | H01Q 13/203 333/237 |
| 7,576,648 B2 * | 8/2009 | Harman | ............. | G01S 13/288 340/552 |
| 7,783,264 B2 * | 8/2010 | Oishi | ............. | H01P 1/184 455/523 |
| 8,018,339 B2 * | 9/2011 | Morita | ............. | G08B 13/10 340/552 |

(Continued)

OTHER PUBLICATIONS http://users.ece.utexas.edu/~bevans/courses/ee382c/lectures/02_signal_processing/project1.html; (Year: 2008) (date is oldest known retrieved from archive.org).*

(Continued)

*Primary Examiner* — Thomas J. Hiltunen
*Assistant Examiner* — Khareem E Almo
(74) *Attorney, Agent, or Firm* — Meunier Carlin & Curfman LLC

(57) ABSTRACT

Example proximity sensors are described. The proximity sensor can include a transceiver unit, and a leaky coaxial cable operably coupled to the transceiver unit. The proximity sensor described herein can be used with a steering wheel. For example, the leaky coaxial cable can be embedded in the steering wheel.

19 Claims, 25 Drawing Sheets

(56) References Cited

U.S. PATENT DOCUMENTS

| | | | | |
|---|---|---|---|---|
| 9,998,870 | B1* | 6/2018 | Bennett | H04B 17/23 |
| 2012/0293390 | A1* | 11/2012 | Shoemaker | H01Q 1/007 |
| | | | | 343/853 |
| 2013/0093638 | A1* | 4/2013 | Shoemaker | H01Q 1/007 |
| | | | | 343/770 |
| 2019/0191463 | A1* | 6/2019 | Namba | H01Q 13/203 |
| 2020/0287614 | A1* | 9/2020 | Judd | H04B 7/15528 |
| 2020/0412003 | A1* | 12/2020 | Lee | H03K 17/945 |

OTHER PUBLICATIONS

Honda Research & Development Americas Inc., Internal Communication, 1 page, Oct. 2018.

Chen, et al., "Design and implementation of capacitive proximity sensor using microelectromechanical systems technology," IEEE Transactions on Industrial Electronics, vol. 45, No. 6, pp. 886-894, Dec. 1998.

Ye, et al., "Capacitive Proximity Sensor Array with a Simple High Sensitivity Capacitance Measuring Circuit for Human-Computer Interaction," IEEE Sensors Journal, vol. 18, No. 14, pp. 5906-5914, 15 Jul. 15, 2018.

Lee, et al., "Feasibility Study of Sitting Posture Monitoring Based on Piezoresistive Conductive Film-Based Flexible Force Sensor", IEEE Sensors Journal, vol. 16, No. 1, pp. 15-16, 2016.

Martin, "Radio communication in mines and tunnels," Electron. Lett., No. 6, pp. 563-564, 1970.

Delongne, et al., "Underground use of a coaxial cable with leaky sections," IEEE Trans. Antennas Propagat., vol. AP-28, pp. 875-883, Nov. 1980.

Inomata, et al., "Wide-area Surveillance Sensor with Leaky Coaxial Cables," 2006 SICE-ICASE International Joint Conference, Busan, pp. 959-963, 2006.

Xu et al., "A High-Resolution Leaky Coaxial Cable Sensor Using a Wideband Chaotic Signal", Sensors, vol. 18, No. 12, p. 4154, 2018.

Hurd, "The modes of an axially slotted coaxial waveguide," Radio Science, vol. 14, No. 5, pp. 741-751, Sep.-Oct. 1979.

Delogne, et al., "Theory of the Slotted Coaxial Cable," IEEE Transactions on Microwave Theory and Techniques, vol. 28, No. 10, pp. 1102-1107, Oct. 1980.

Hassan, "Field solution and propagation characteristics of monofilar-bifilar modes of axially slotted coaxial cable," IEEE Transactions on Microwave Theory and Techniques, vol. 37, No. 3, pp. 553-557, Mar. 1989.

Kim, et al., "Numerical analysis of the propagation characteristics of multiangle multislot coaxial cable using moment method," IEEE Transactions on Microwave Theory and Techniques, vol. 46, No. 3, pp. 269-279, Mar. 1998.

Wang, et al., "Theory and analysis of leaky coaxial cables with periodic slots," IEEE Transactions on Antennas and Propagation, vol. 49, No. 12, pp. 1723-1732, Dec. 2001.

Kim, et al., "Radiation of a Leaky Coaxial Cable with Narrow Transverse Slots," IEEE Transactions on Antennas and Propagation, vol. 55, No. 1, pp. 107-110, Jan. 2007.

Wang, et al., "Design of leaky coaxial cables with periodic slots," Radio Science, vol. 37, No. 5, pp. 1-10, Oct. 2002.

Wang, "Research on the Radiation Characteristics of Patched Leaky Coaxial Cable by FDTD Method and Mode Expansion Method," IEEE Transactions on Vehicular Technology, vol. 57, No. 1, pp. 90-96, Jan. 2008.

Van Biesen, et al., "High accuracy location of faults on electrical lines using digital signal processing", IEEE Transactions on Instrumentation and Measurement, vol. 39, No. 1, pp. 175-179, 1990.

Shin et al., "Application of Time-Frequency Domain Reflectometry for Detection and Localization of a Fault on a Coaxial Cable", IEEE Transactions on Instrumentation and Measurement, vol. 54, No. 6, pp. 2493-2500, 2005.

Cozza, et al., "Echo Response of Faults in Transmission Lines: Models and Limitations to Fault Detection", IEEE Transactions on Microwave Theory and Techniques, vol. 64, No. 12, pp. 4155-4164, 2016.

Zhang, et al., "Analysis of Time-Domain Reflectometry Combined with Wavelet Transform for Fault Detection in Aircraft Shielded Cables", IEEE Sensors Journal, vol. 16, No. 11, pp. 4579-4586, 2016.

SPEAG, Schmid & Partner Engineering AG. [online] Available at https://speag.swiss/products/em-phantoms/phantoms/popeye-v10/ (accessed Dec. 30, 2020). 2 pages.

Gabriel, "Tissue Equivalent Material for Hand Phantoms," Physics in Medicine and Biology, 52 (2007), pp. 4205-4210.

Yee, "Numerical solution of initial boundary value problems involving Maxwell's equations in isotropic media," IEEE Transactions on Antennas and Propagation, vol. 14, No. 3, pp. 302-307, May 1966.

Mur, "Absorbing Boundary Conditions for the Finite-Difference Approximation of the Time-Domain Electromagnetic-Field Equations," IEEE Transactions on Electromagnetic Compatibility, vol. EMC-23, No. 4, pp. 377-382, Nov. 1981.

Lee, et al., "Electromagnetic coupling by a wire through a circular aperture in an infinite planar screen," Journal of Electromagnetic Waves and Applications, vol. 3, No. 4, pp. 281-305, 1989.

Lee, et al., "Transient current propagation along a wire penetrating a circular aperture in an infinite planar conducting screen," IEEE Transactions on Electromagnetic Compatibility, vol. 32, No. 2, pp. 137-143, May 1990.

Times microwave systems (2019). [online] Available at https://www.timesmicrowave.com/DataSheets/CableProducts/LMR-240-UF.pdf pp. 62-63.

Park, et al., "A Time Domain Artificial Intelligence Radar System Using 33-GHz Direct Sampling for Hand Gesture Recognition", IEEE Journal of Solid-State Circuits, vol. 55, No. 4, pp. 879-888, Apr. 2020.

Jadoon, et al., "Analysis of horn antenna transfer functions and phase-center position for modeling off-ground GPR" IEEE Trans. Geosci. Remote Sens., vol. 49 No. 5 pp. 1649-1662, May 2011.

Che, et al., "Novel In Situ Boundary Detection Algorithm for Horizon Control in Longwall Mining," IEEE Geoscience and Remote Sensing Letters, vol. 14, No. 10, pp. 1875-1879, Oct. 2017.

Vanhamme, "High resolution frequency-domain reflectometry," IEEE Transactions on Instrumentation and Measurement, vol. 39, No. 2, pp. 369-375, Apr. 1990.

Liu, et al., "Application of Pulse Compression Technique in Fault Detection and Localization of Leaky Coaxial Cable," IEEE Access, vol. 6, pp. 66709-66714, 2018.

Fernandes, et al., "Recent advances in IR-UWB transceivers: An overview," Proceedings of 2010 IEEE International Symposium on Circuits and Systems, Paris, 2010, pp. 3284-3287.

\* cited by examiner

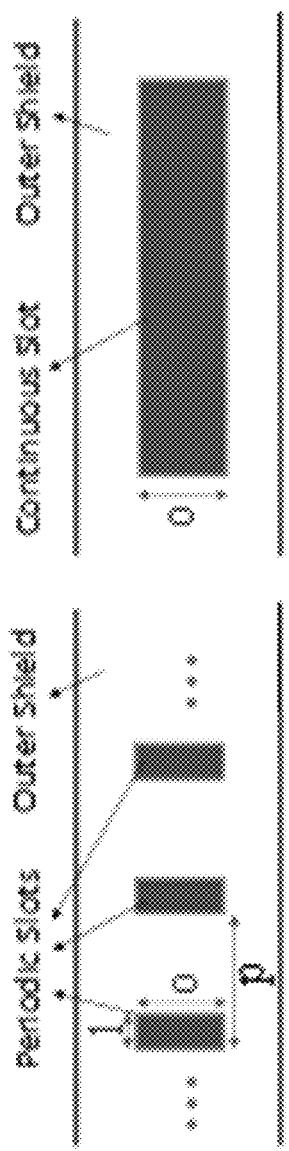
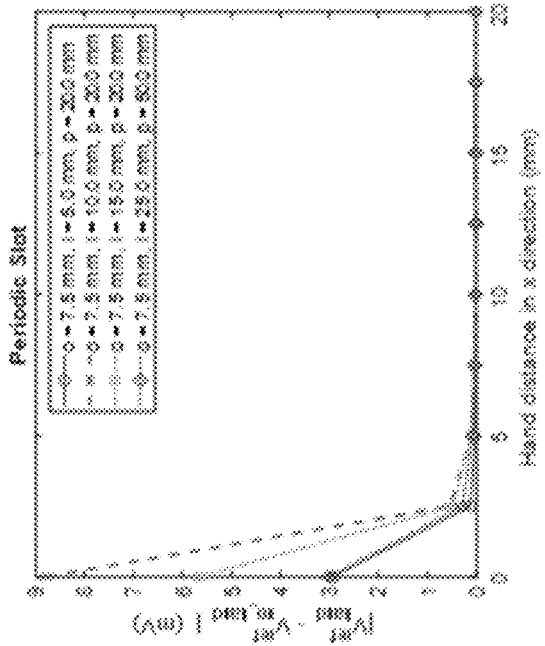
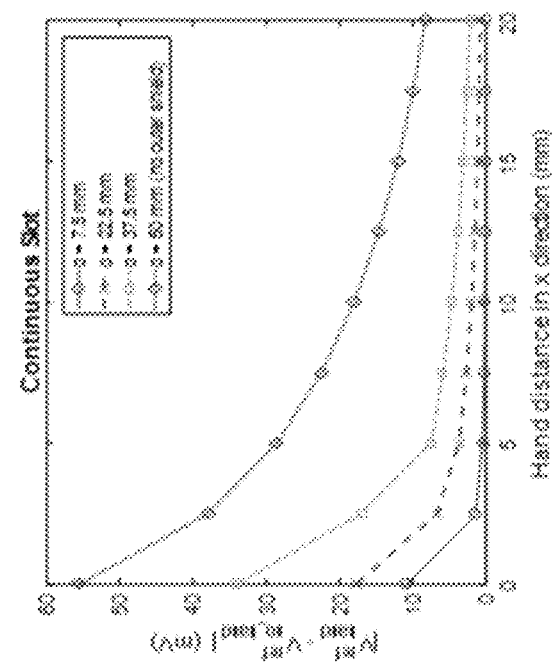
FIG. 8A
FIG. 8B
FIG. 8C
FIG. 8D

TABLE I
COMPARISON BETWEEN NUMERIC AND 3D PRINTED LCX

| Parameter | Numeric Cable | 3D printed Cable |
|---|---|---|
| Cross section | | |
| $b:a$ | 5:1 | 4.4:1 |
| Substrate $\varepsilon_r$ | 2.8 | 2.8 |
| Characteristic Impedance[a] without slot | 53 Ohms | 53 Ohms |
| Slot width | 12.5 mm | 7.5 mm |
| Characteristic Impedance[a] with continuous slot | 57 Ohms | 57 Ohms |
| Terminals | Absorbing boundary condition | 50 Ohms |
| $|S11|$ for continuous slot cable @ 800 MHz | 0.0556 | 0.0663 |

[a] All characteristic impedance are obtained by solving the static field by FEM (Finite Element Method)

*FIG. 10*

TABLE II
EXPLANATIONS FOR THE PEAKS

| Marker Number | Location on the cable (meter) | Discontinuities |
|---|---|---|
| 1 | 0 | Connecter and adapter on left end |
| 2 | 0.10 | Starting point of slot |
| 3 | 0.28 | Gap between two printed segments |
| 4 | 0.40 | Gap between two printed segments |
| 5 | 0.68 | Connecter and adapter on right end |

*FIG. 14*

PROXIMITY SENSOR USING A LEAKY COAXIAL CABLE

CROSS-REFERENCE TO RELATED APPLICATIONS

This application claims the benefit of U.S. provisional patent application No. 62/866,694, filed on Jun. 26, 2019, and entitled "PROXIMITY SENSOR USING A LEAKY COAXIAL CABLE," the disclosure of which is expressly incorporated herein by reference in its entirety.

BACKGROUND

The coming age of autonomous vehicles will require the development of many new technologies to keep the vehicle occupants safe even when no one is paying attention to the vehicle operation. At present, given the limited capabilities of autonomous vehicles, it is necessary for the driver to monitor the vehicle and take over driving in a split second. One way for the vehicle to recognize that the driver can to take over control of the vehicle is to determine if the driver has his or her hands on the steering wheel. The location of the hands may also important to determine how attentive the driver is.

The main hand sensor on the market right now is based on a capacitive sensor system similar to what is used in touchscreens. A disadvantage of this approach is that the sensitivity of the system is dependent on the electrical characteristics of the hand which may vary with individuals and even vary with a single individual based on the environment (e.g. dry versus humid). Also, if the driver is wearing gloves, the capacitive sensor may not work well or work at all. Another problems is the complexity of the electronics associated with a capacitive sensor, which can have a large footprint and make such a sensor not feasible for use in a vehicle steering wheel.

SUMMARY

The present disclosure pertains to a proximity sensor. An example proximity sensor can include a transceiver unit, and a leaky coaxial cable operably coupled to the transceiver unit. The proximity sensor described herein can be used with a steering wheel. For example, a steering wheel can include a frame and a foam layer. The leaky coaxial cable can be embedded in the steering wheel. Additionally, the proximity sensor can be configured to detect a driver's hand.

An example proximity sensor is described herein. The proximity sensor includes a transceiver unit and a leaky coaxial cable operably coupled to the transceiver unit.

In some implementations, the proximity sensor includes a load operably coupled to the transceiver unit via the leaky coaxial cable.

In some implementations, the leaky coaxial cable includes at least one shielding layer having an opening formed therein, the opening in the at least one shielding layer allowing for energy leakage from the leaky coaxial cable.

In some implementations, the leaky coaxial cable includes a conductive core, a dielectric layer surrounding the conductive core, and a conductive shielding layer surrounding the dielectric layer, where the opening is formed in the conductive shielding layer.

Alternatively or additionally, the proximity sensor includes an outer sheath surrounding the conductive shielding layer, where the opening is formed in the outer sheath.

In some implementations, the at least one shielding layer has a plurality of openings formed therein. Optionally, the openings are spaced apart along an axially direction of the leaky coaxial cable.

In some implementations, the proximity sensor includes a controller, the controller includes a processing unit and a memory operably coupled to the processing unit, the memory having computer-executable instructions stored thereon that, when executed by the processing unit, cause the processing unit to: compare an input signal to a response signal; and detect an object in proximity to the leaky coaxial cable based on the comparison.

Alternatively or additionally, the memory has further computer-executable instructions stored thereon that, when executed by the processing unit, cause the processing unit to periodically calibrate the proximity sensor. Optionally, the transceiver unit is a modulated pulse transceiver unit.

Alternatively or additionally, the modulated pulse transceiver unit is configured to: modulate the input signal using a carrier signal and demodulate the response signal. Optionally, the modulated pulse transceiver unit is further configured to generate the input signal, transmit the modulated input signal via the leaky coaxial cable, and receive the response signal via the leaky coaxial cable. Optionally, the carrier signal has a frequency of about 2.45 gigahertz (GHz).

In some implementations, the transceiver unit comprises a rectifier and a filter, where the filter is configured to reduce or eliminate radiofrequency (RF) components of a reflected signal and the rectifier is configured to convert the reflected signal to a direct current (DC) component. Optionally, the transceiver unit further includes an analog-to-digital converter (ADC), where the ADC is configured to sample the DC component of the reflected signal.

In some implementations, the transceiver unit is configured to transmit an input signal to the leaky coaxial cable and generate a direct current (DC) output signal from a reflected input signal. Optionally, the input signal is a radiofrequency (RF) signal.

An example steering wheel, is described herein. The steering wheel includes a frame, a foam layer and the proximity sensor, where the leaky coaxial cable is embedded in and/or attached to at least one of the frame or the foam layer. Optionally, the proximity sensor is configured to detect presence of a driver's hand. In some implementations, the proximity sensor is configured to detect a location of the driver's hand relative to the steering wheel.

It should be understood that the above-described subject matter may also be implemented as a computer-controlled apparatus, a computer process, a computing system, or an article of manufacture, such as a computer-readable storage medium.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIG. 3A is a diagram illustrating a front view of the steering wheel. FIG. 3B is a diagram of a cross sectional view of the steering wheel.

FIG. 6A illustrates the FDTD configuration, coordinate and meshing. FIG. 6B illustrates the simulated hand positions.

FIGS. 8A-8D are diagrams illustrating simulation results. FIG. 8A is an illustration of a periodic slot configuration; FIG. 8B is an illustration of a continuous slot configuration; FIG. 8C illustrates the difference of voltage amplitude between hand on top of the cable and without hand (detected at z=12.5 mm) for the continuous slot configuration of FIG. 8B; and FIG. 8D illustrates the difference of voltage amplitude between hand on top of the cable and without hand (detected at z=12.5 mm) for the periodic slot configuration of FIG. 8A. In FIGS. 8A-8D, 'o' represents the width of the slot opening, 'l' represents the length of slot over one period for the periodic case, and 'p' represents the period length in the legend.

FIG. 9A illustrates LCX fabrication using a 3D-printing process and FIG. 9B illustrates a measurement setup for the 3D-printed LCX.

FIG. 10 is a table (Table I) illustrating a comparison between two implementations of LCX cables (i.e., a simulation ("numeric cable") and a 3D-printed LCX cable).

FIG. 14 is a table (Table II) showing the position of discontinuities in an LCX according to the example described herein.

FIG. 15A illustrates the impulse response with a hand positioned at 0.095 meters; FIG. 15B illustrates the impulse response with a hand positioned at 0.195 meters; FIG. 15C illustrates the impulse response with a hand positioned at 0.295 meters; and FIG. 15D illustrates the impulse response with a hand positioned at 0.395 meters.

In FIG. 16, 'o' represents the width of the slot opening.

FIG. 19A illustrates the voltage difference when the hand is placed at position 'a'; FIG. 19B illustrates the voltage response when the hand is placed at position 'b'; and FIG. 19C illustrates the voltage response when the hand is placed at position 'c'.

FIG. 21A illustrates the voltage amplitude difference when a finger (see FIG. 20A) is placed at position 'a'; FIG. 21B illustrates the voltage difference when a hand with a leather glove (see FIG. 20B) is placed on position 'a'; and FIG. 21C illustrates the voltage difference when a hand with a winter glove (see FIG. 20C) is placed at position 'a'.

DETAILED DESCRIPTION

Figure 1A:
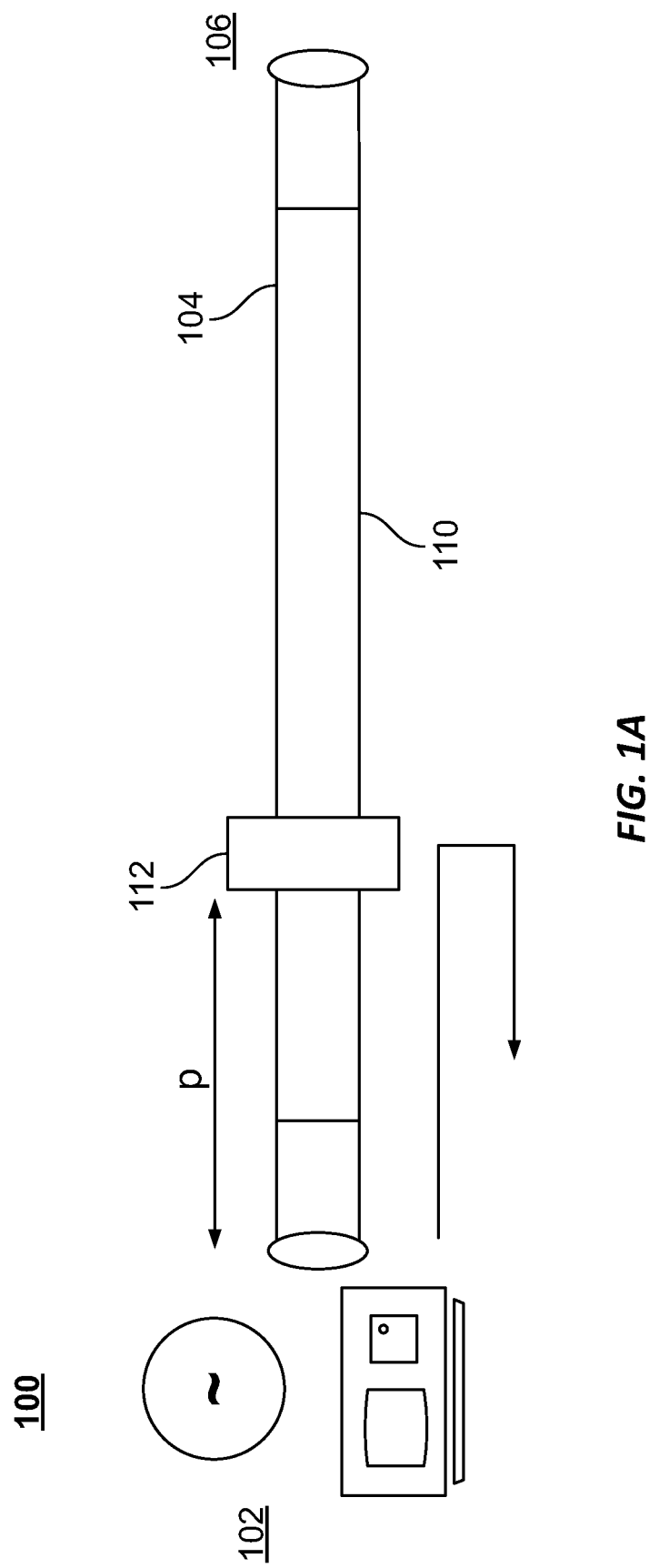
FIGS. 1A and 1B are diagrams illustrating a proximity sensor based on a leaky coaxial cable according to implementations described herein.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. While implementations will be described for a leaky coaxial cable proximity sensor used with a steering wheel, it will become evident to those skilled in the art that the implementations are not limited thereto, but are applicable for other proximity sensing applications including, but not limited to, autonomous systems and border security.

A partially shielded (leaky) coaxial line for use as a proximity sensor is described herein. In some implementations, the leaky coaxial cable is partially shielded. In some implementations, the leaky coaxial cable is unshielded. The proximity sensor described herein takes advantage of the near-field properties of a leaky coaxial cable. In particular, the proximity sensor takes advantage of how an object such as human tissue interacts with near-field electromagnetic waves and cause reflection on the cable. It should be understood that human tissue (e.g., hand) is provided only as an example object. This disclosure contemplates that the proximity sensor described herein can be used to detect other objects with large permittivity or conductivity. Non-limiting examples of entities that can be detected include humans and animals. Additionally, the proximity sensor may be used to detect human or animal organs, tissue, blood vessels and other body parts when deployed inside a body. In some implementations, the proximity sensor described herein is used for medical or surgical procedures (e.g. intubation or catheterization). In some implementations, the proximity sensor described herein is embedded into a vehicle steering wheel. It should be understood that a steering wheel is only one example application for the proximity sensor. This disclosure contemplates using the proximity sensor for other applications. Because the coaxial line is partially shielded or unshielded, the presence of an object close to the coaxial line will affect the signal traveling through along the line. From the reflected signal, the distance between the object and the coaxial line and the location of the object on the steering wheel can be determined.

Figure 1B:
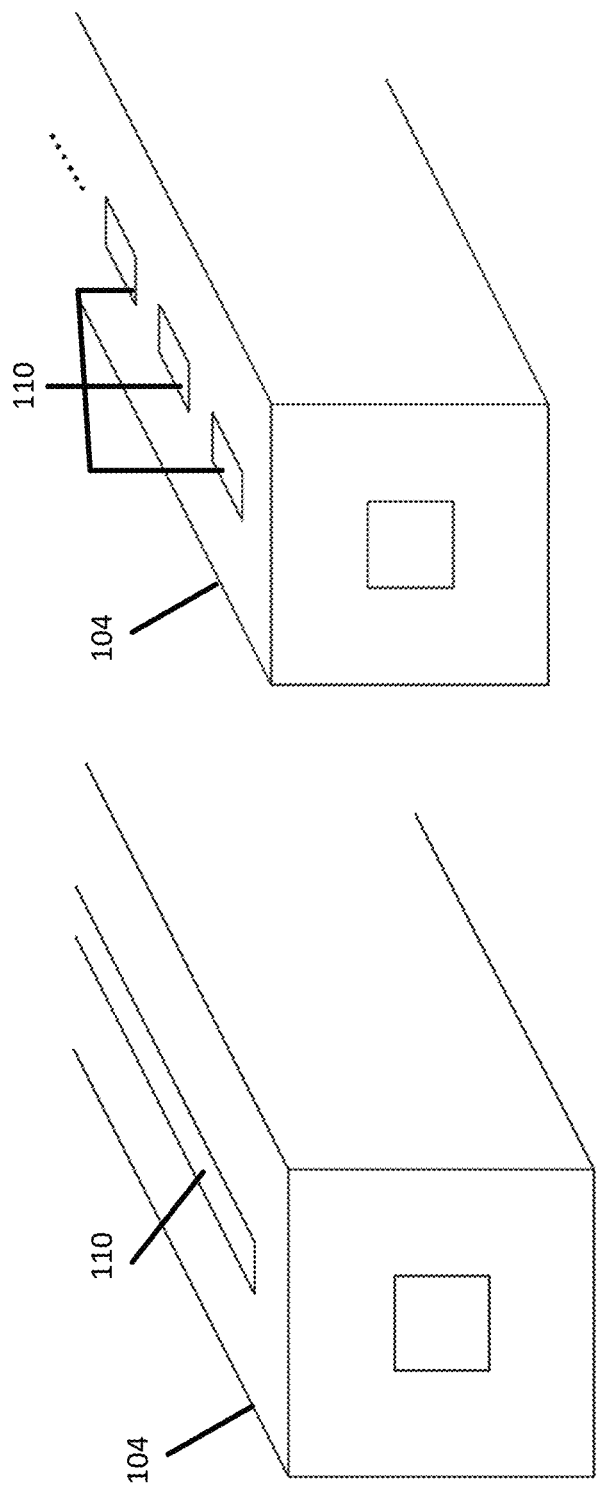

Referring now to FIGS. 1A and 1B, an example proximity sensor is described. The proximity sensor 100 can include a transceiver unit 102, and a leaky coaxial cable 104 operably coupled to the transceiver unit 102. The proximity sensor 100 can also include a load 106 operably coupled to the transceiver unit 102 via the leaky coaxial cable 104. As described herein, the leaky coaxial cable 104 includes a conductive core that is configured to transmit signals between the transceiver 102 and the load 106. In some implementations, the load 106 can be connected across one terminal of the leaky coaxial cable 104, while the transceiver unit 102 is connected to the other terminal of the leaky coaxial cable 104. In some implementations, the proximity sensor 100 can include two transceiver units, each transceiver unit connected to a different terminal of the leaky coaxial cable, where each transceiver unit acts as the load with respect to the other. Alternatively or additionally, the load 106 can be a resistance, for example a 50 Ohm resistor, or a short circuit, or an open circuit. These resistance values are intended as non-limiting examples, and other resistances are possible. For example, in some implementations, the load 106 can optionally be configured to fully absorb the signal. In other implementations, the load 106 can be configured to not fully absorb the signal. The object (e.g., a hand) is labeled in FIG. 1A with reference number 112.

The transceiver unit 102 can be configured to generate, transmit, and receive radiofrequency (RF) signals such as microwaves (e.g., electromagnetic radiation with wavelengths ranging from about one meter to one millimeter). When an object 112 such as a hand approaches the leaky coaxial cable 104, there will be extra discontinuity on the leaky coaxial cable 104, which reflects some part of the microwave back to the transceiver unit 102. Because the speed of the microwave is known (i.e., speed of light over square root of cable substrate permittivity) and the reflected wave travelling time in the leaky coaxial cable 104 can be measured by the transceiver unit 102, then the position of the object such as a hand can be determined, for example, using equation (2) below. In some implementations, multiple transceiver units 102 can be used to detect multiple objects (e.g. two transceiver units 102 configured to detect two hands in proximity to a steering wheel). As described above, each transceiver unit 102 can be connected to a different terminal of the leaky coaxial cable 104.

Figure 3A:
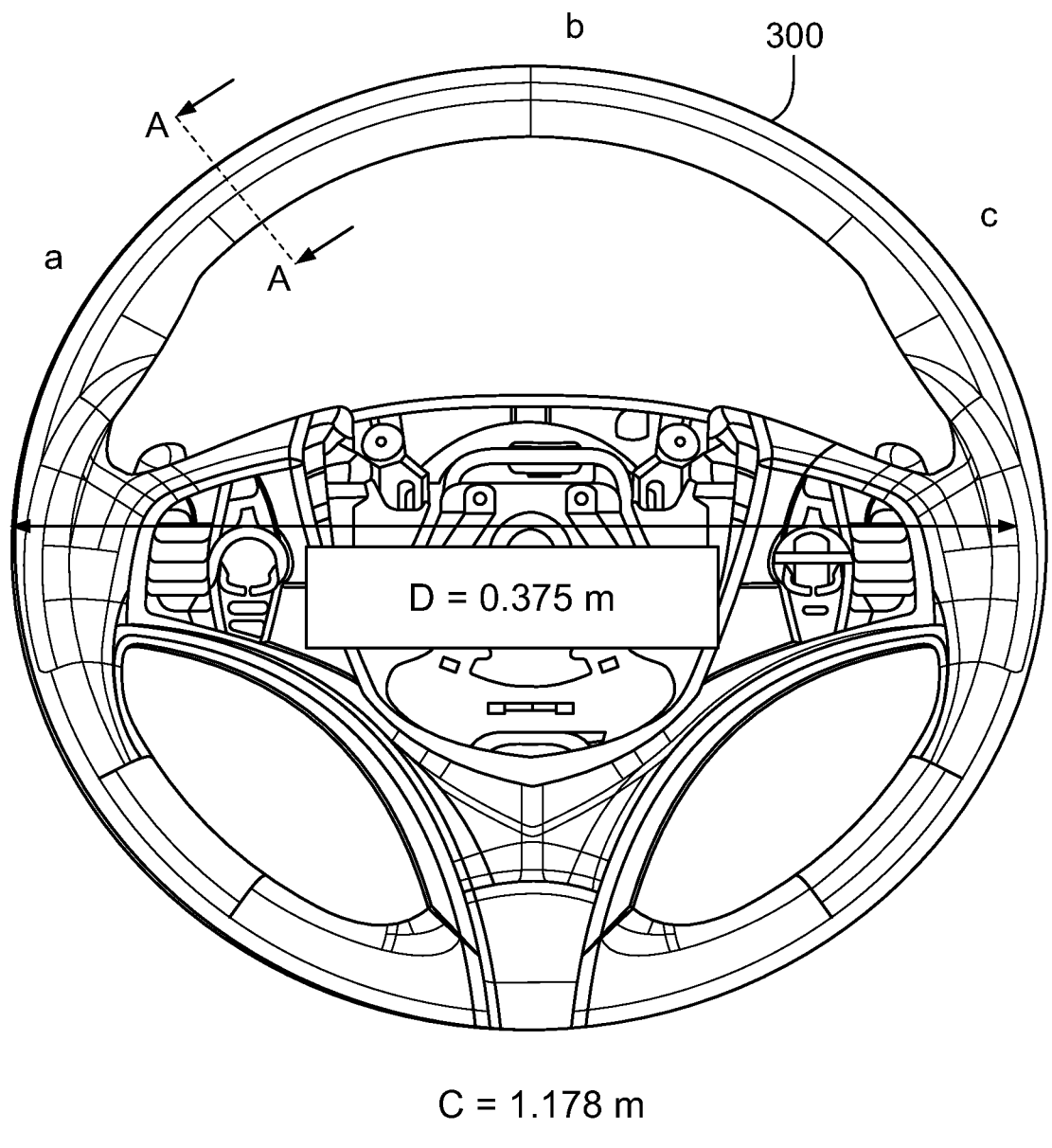
FIGS. 3A and 3B are diagrams illustrating an example steering wheel according to implementations described herein.
Figure 3B:
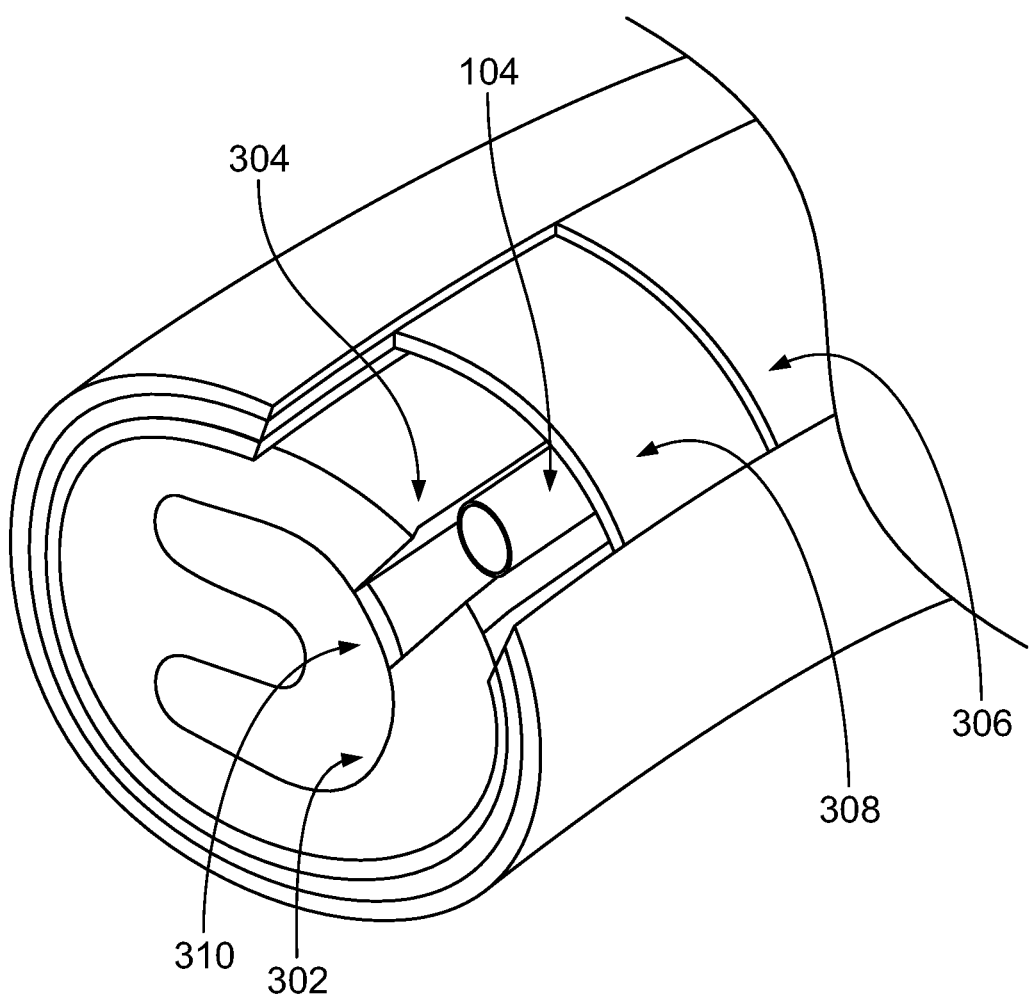

Referring now to FIGS. 3A and 3B, the proximity sensor 100 described with regard to FIGS. 1A-1B can be used with a steering wheel 300. For example, a steering wheel 300 can include a frame 302 and a foam layer 304. It should be understood that the frame 302 is a rigid structure defining the shape of the steering wheel 300. The foam layer 304 is arranged around at least a portion of the frame 302. The leaky coaxial cable 104 can be embedded in the steering wheel 300. For example, in some implementations, the leaky coaxial cable 104 is attached to the frame 302. In this implementation, the foam layer 304 is provided over the leaky coaxial cable 104 or a gap is provided in the foam layer 304 in the region in proximity to the leaky coaxial cable 104. In other implementations, the leaky coaxial cable 104 is attached to the foam layer 304. The leaky coaxial cable 104 can be attached to the frame 302 and/or the foam layer 304 using an adhesive layer 310 such as doubled sided tape, for example. As described herein, the sensitivity of a proximity sensor is affected by the distance between the leaky coaxial cable 104 and the object such as a hand (not shown). For example, as the distance between the leaky coaxial cable 104 and the object such as a hand (not shown) increases, the sensitivity of the proximity sensor 100 decreases. In some implementations, the distance between the leaky coaxial cable 104 and the hand (not shown) placed on the external surface of the steering wheel 300 is less than about 5 millimeters (mm). In some implementations, the distance between the leaky coaxial cable 104 and the external surface of the steering wheel 300 is less than about 4 mm. In some implementations, the distance between the leaky coaxial cable 104 and the hand (not shown) placed on the external surface of the steering wheel 300 is less than about 3 mm. In some implementations, the distance between the leaky coaxial cable 104 and the hand (not shown) placed on the external surface of the steering wheel 300 is less than about 2 mm. In some implementations, the distance between the leaky coaxial cable 104 and the hand (not shown) placed on the external surface of the steering wheel 300 is less than about 1 mm. It should be understood that if the hand is covered, for example by a glove, then the distance from the leaky coaxial cable 104 to the hand is increased, and the sensitivity of a proximity sensor can be affected.

It should be understood that the transceiver unit 102 and/or the load 106 shown in FIG. 1A are not required to be embedded in the steering wheel 300. In other words, the transceiver unit and/or the load can be located externally with respect to the steering wheel 300 and operably connected by the leaky coaxial cable 104, which is embedded in the steering wheel 300. Optionally, the steering wheel 300 can include other components and/or layers. For example, the steering wheel 300 can optionally include a heating mat 308. Alternatively or additionally, the steering wheel 300 can optionally include an outer covering 306 such as leather. It should be understood that the sensitivity of a proximity sensor can be affected by the number, thickness, and/or materials of additional layers. As described herein, the proximity sensor can be configured to detect presence and/or location of a driver's hand relative to the steering wheel 300.

Referring again to FIGS. 1A and 1B, the leaky coaxial cable 104 can include at least one shielding layer having an opening 110 (sometimes referred to herein as "slot") formed therein. The opening allows for energy leakage from the coaxial cable. This allows body tissue (e.g., finger or hand, which can be gloved or ungloved) to interact with near-field electromagnetic waves and cause reflection on the leaky coaxial cable 104. As a result, the presence and/or location of an object such as a human hand affects the signal travelling through the coaxial cable. This allows the object to be detected by signal analysis. For example, the magnitude of a reflected signal (e.g., pulse) can be used to detect the presence of an object such as a hand in proximity to the leaky coaxial cable 104. Alternatively or additionally, the location of an object such as a hand along the axial direction of the leaky coaxial cable 104 can be determined by measuring the time needed for a reflection to return to its source.

As described herein, the leaky coaxial cable 104 includes at least one shielding layer. As described above, in some implementations, the leaky coaxial cable 104 is partially shielded (i.e., portion of the shielding layer is removed), while in other implementations the leaky coaxial cable 104 is completely unshielded (i.e., the entire shielding layer is removed). One or more openings 110 (sometimes referred to as "slots") are formed in the shielding layer as shown in FIG. 1B. In some implementations, a single opening 110 is formed in the shielding layer of the leaky coaxial cable 104, which is shown on the left side of FIG. 1B. This is also referred to herein as a continuous slot configuration. A continuous slot extends continuously (i.e., without interruption) along a portion of the leaking coaxial cable 104 in the axial direction (e.g., z-direction). It should be understood that the sensitivity of the proximity sensor 104 described herein is effected by the size (e.g., length, diameter) of the leaky coaxial cable 104 and/or the depth at which the leaky coaxial cable 104 is embedded in a system such as a steering wheel. Additionally, as described herein, the sensitivity of the proximity sensor 104 is affected by the geometry of the opening 110. For example, a wider slot allows for more leakage of the electromagnetic wave, resulting in a greater reflection. Optionally, the slot width can be equal to about one-half of the circumference of the outer diameter of the leaky coaxial cable 104 (e.g., 5-6 mm for the LMR-240 cable described in the examples below). For example, the shielding layer can be removed from approximately one-half of the circumference of the leaky coaxial cable 104 to form the opening 110. As a non-limiting example, in one implementation, the coaxial cable sold under the trademark LMR-240 is used and the leaky coaxial cable is embedded 2-3 mm deep, and a half-circumference slot width is used. However, different slot widths can be ideal for different diameters of cable. For example, the slot width may be between 15 and 100 percent of the size of the circumference of a leaky coaxial cable. The optimal slot width depends on the size of the leaky coaxial cable and the system in which it is embedded.

In other implementations, a plurality of openings 110 are formed in the shielding layer of the leaky coaxial cable 104, which is shown on the right side of FIG. 1B. This is also referred to herein as a periodic slot configuration. A periodic slot includes multiple distinct slots that are spaced apart along a portion of the leaking coaxial cable 104 in the axial direction (e.g., z-direction). For example, the openings can be spaced apart along an axially direction (e.g., z-direction) of the leaky coaxial cable 104. Optionally, the openings are periodic. This disclosure contemplates that the number, size, and/or shape of the opening(s) impacts the sensitivity of the proximity sensor 100.

As described herein, the continuous slot configuration provides advantages as compared to the periodic slot configuration. For example, the near-field distribution of the electromagnetic field is non-uniform along the axial direction of the cable for the periodic slot configuration, which creates more uncertainty. Additionally, voltage difference declines rapidly as an object such as a hand is moved farther from the leaky coaxial cable 104 with a periodic slot configuration. Accordingly, such a leaky coaxial cable should be placed no more than 2-3 mm from the external sensing surface (e.g., steering wheel exterior) when using a periodic slot configuration. In the case of a continuous slot configuration, voltage difference decreases at a much slower rate as an object such as a hand is moved farther from the leaky coaxial cable 104.

Figure 2:
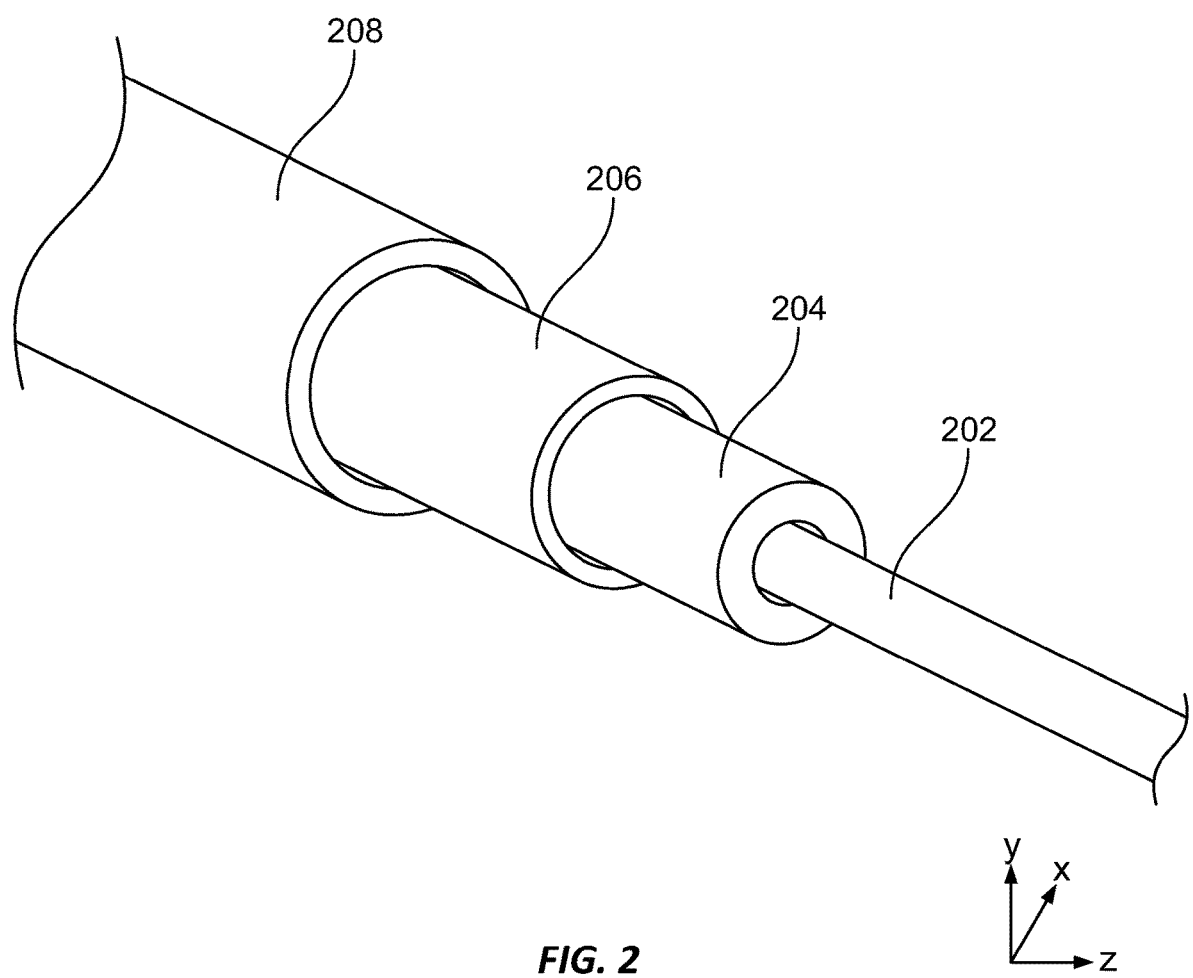
FIG. 2 is a diagram illustrating a coaxial cable.

Referring now to FIG. 2, a coaxial cable can include a conductive core 202, a dielectric layer 204 surrounding the conductive core 202, a conductive shielding layer 206 surrounding the dielectric layer 204, and an outer sheath 208 surrounding the conductive shielding layer 206. The metallic shielding (e.g., layer 206) conserves the signal transmitted on the conductive core 202. An example commercial coaxial cable is sold under the trademark LMR-240 Times Microwave Systems, Inc. of Wallingford, Conn. Coaxial cables are widely used in RF and microwave circuits for transmitting microwave signals between components. Coaxial cables are known in the art and therefore not described in further detail herein. As described herein, the opening 110 can be formed in the conductive shielding layer 206. This makes the coaxial cable "leaky" such that some of the energy escapes. Additionally, the outer sheath 208 can be, for example, a plastic jacket that is used to protect the physical structure of the cable and avoid some interference from the outside. In some implementations, the outer sheath 208 may be nonexistent or completely removed from the leaky coaxial cable 104.

Figure 5:
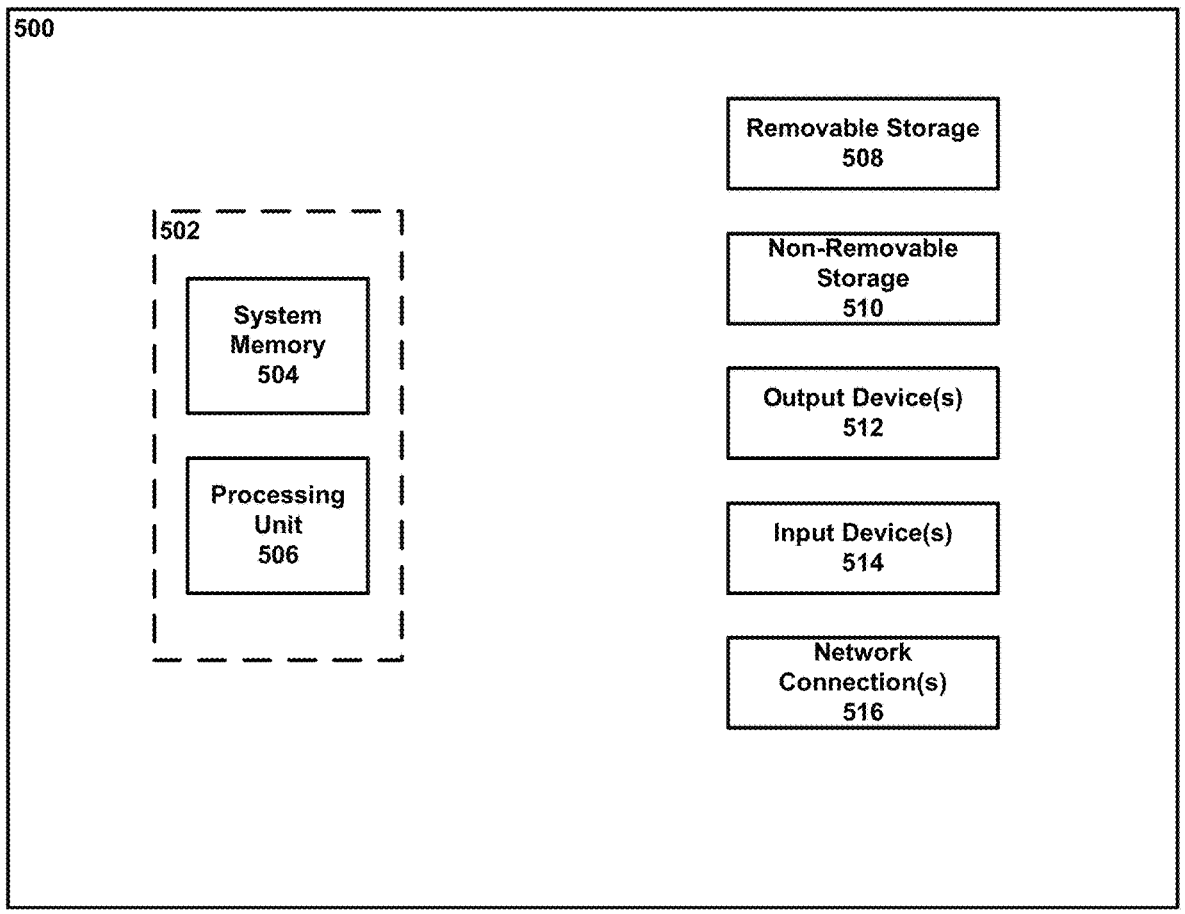
FIG. 5 is a diagram illustrating an example computing device.

Referring again to FIG. 1A-1B, the proximity sensor 100 can further include a controller (e.g., computing device 500 of FIG. 5). The controller can be operably coupled to the transceiver unit 102, for example, using a communication link. This disclosure contemplates that the communication link is any suitable communication link. For example, a communication link may be implemented by any medium that facilitates data exchange including, but not limited to, wired, wireless and optical links. Example communication links include, but are not limited to, a local area network (LAN), a wireless local area network (WLAN), a wide area network (WAN), a metropolitan area network (MAN), Ethernet, the Internet, or any other wired or wireless link such as WiFi, WiMax, 3G, 4G, or 5G. The controller can be configured to compare an input signal to a response signal (reflected wave), and detect an object in proximity to the leaky coaxial cable 104 based on the comparison. It should be understood that there will be a difference in amplitude of the reflected wave for: (i) cases with an object such as a hand placed on or near the leaky coaxial cable ("hand on"), and (ii) cases without an object such as a hand placed off or away from the leaky coaxial cable ("hand off"). The controller can be configured to use this expected difference in amplitude of the reflected wave to detect the presence of an object such as a hand placed in proximity to (e.g., on or near) the leaky coaxial cable 104. Alternatively or additionally, the location of an object such as a hand along the axial direction of the leaky coaxial cable 104 can be determined by measuring the time needed for a reflection to return to its source. Thus, the controller can be configured to detect presence and/or location of the object by analyzing the input and response signals. For example, when embedded in a steering wheel, the proximity sensor can detect presence and/or location of the object (e.g., a driver's hand) relative to the steering wheel.

In some implementations, the transceiver unit 102 can be a modulated pulse transceiver unit. The modulated pulse transceiver unit can be configured to modulate the input signal using a carrier signal, and demodulate the response signal. Optionally, the input signal is a 1 microsecond (psec) pulse. The carrier signal can be a radiofrequency (RF) signal. Optionally, the carrier signal has a frequency of about 2.45 gigahertz (GHz). It should be understood that the characteristics of the input signal and/or carrier signal are provided only as examples. This disclosure contemplates using input signals with longer or shorter pulse lengths and/or carrier signals with frequencies more or less than 2.45 GHz. Additionally, the modulated pulse transceiver unit can be further configured to generate the input signal, transmit the modulated input signal to the load 106 via the leaky coaxial cable 104, and receive the response signal (reflected signal) via the leaky coaxial cable 104. Optionally, in some implementations, the proximity sensor 100 can be configured to periodically perform calibration, e.g., by transmitting calibration pulse(s) and comparing the same to the response(s) when the driver's hands are not near the steering wheel.

Figure 4A:
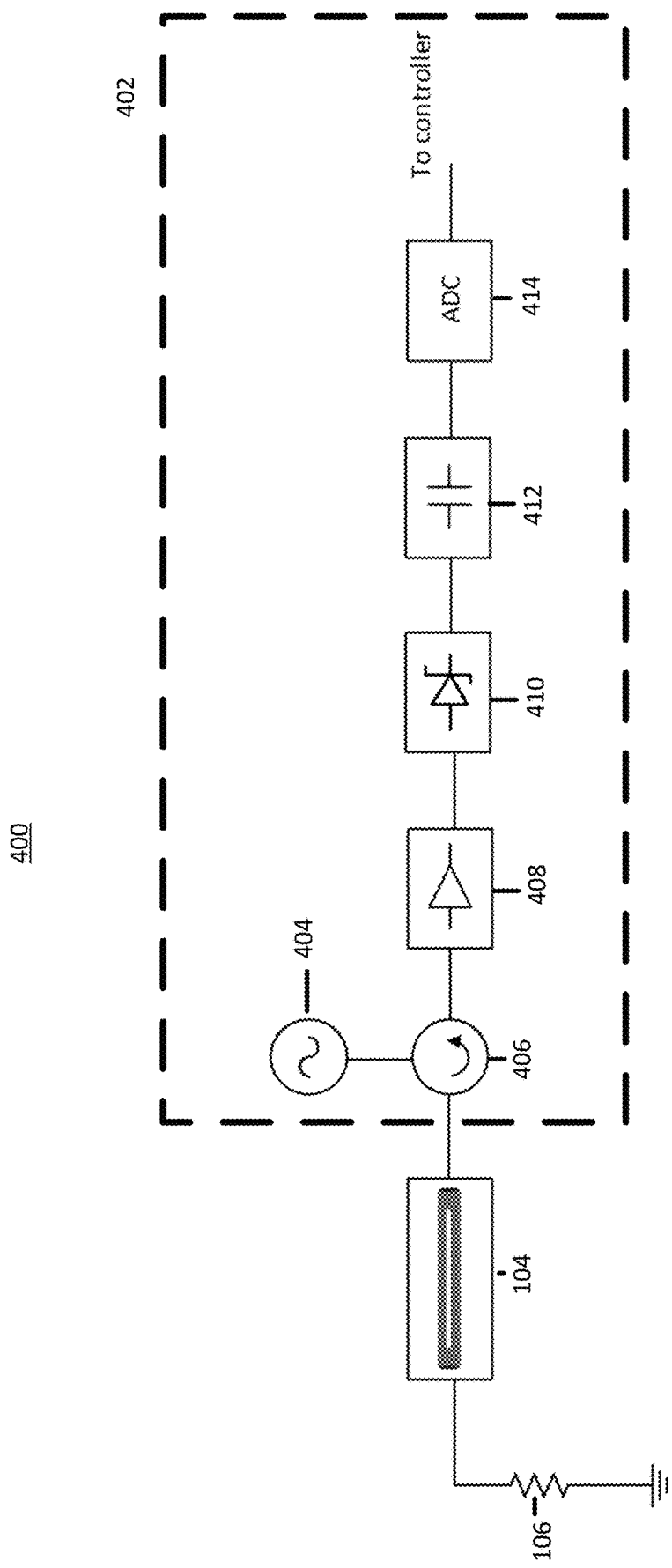
FIGS. 4A-B are block diagrams illustrating a proximity sensor and transceiver circuit according to an implementation described herein.

Referring now to FIG. 4A, a block diagram illustrating an example proximity sensor 400 and transceiver unit 402 is shown. The transceiver unit 402 in FIG. 4A is configured to reduce or eliminate radiofrequency (RF) components and pass a direct current (DC) component of the reflected signal for further processing by the controller (e.g., computing device 500 shown in FIG. 5). This provides a low cost means for detecting the presence and/or location of an object such as a hand in proximity to a leaky coaxial cable. The transceiver unit 402 in FIG. 4A is better suited for detecting the presence of an object such as a hand in proximity to the leaky coaxial cable than for detecting the location of the object. It should be understood that the transceiver unit 402 in FIG. 4A is provided only as an example.

As shown in FIG. 4A, the proximity sensor 400 includes a leaky coaxial cable 104, the transceiver unit 402, and a load 106. The leaky coaxial cable 104 and load 106 are described in detail above and therefore not described in further detail with regard to FIG. 4A. The transceiver unit 402 is operably coupled to the load 106 via the leaky coaxial cable 104. The transceiver unit 402 includes a local oscillator 404, a circulator 406, an amplifier 408, a rectifier 410, a filter 412, and an analog-to-digital converter (ADC) 414. The circulator 406 can be a three-port device configured to ensure that a signal is transmitted in a single direction through the proximity sensor 400. The circulator 406 is operably connected between the leaky coaxial cable 104 and the transceiver unit 402. The circulator 406 is configured to pass the signal generated by the local oscillator 404 to the leaky coaxial cable 104 and pass the signal reflected by the leaky coaxial cable 104 to the transceiver unit 402. The local oscillator 404, which is operably connected to the circulator 406, can generate the signal (input signal) that is transmitted through the leaky coaxial cable 104. In the example shown in FIG. 4A, the local oscillator 404 is a 2.45 GHz voltage-controlled oscillator that is used to generate a 2.45 GHz carrier wave. However, in other implementations, different types of oscillators can be used, and different frequencies of carrier wave can be generated. The amplifier 408 can amplify the signal reflected from the leaky coaxial cable 104. The reflected signal is received by the transceiver unit 402. The amplifier 408 can optionally be a single transistor amplifier, an operational amplifier, or other amplifier. In other implementations, the transceiver unit 402 can be constructed without an amplifier 408. After the reflected signal is amplified by the amplifier 408, the reflected signal can be input into a rectifier 410 and also into a filter 412. The rectifier 410 and filter 412 can demodulate high frequency RF signals to low frequency and DC components. In some implementations, the rectifier 410 is a half bridge or full bridge circuit, where the bridge circuit is constructed of diodes such as fast-switching Schottky diodes. Bridge circuits are provided only as example rectifiers. This disclosure contemplates using other types of rectifiers in the transceiver unit 402. The filter 412 can smooth the voltage of the demodulated signal and eliminate or reduce RF components in the signal. In this way, the rectifier 410 and filter 412 pass only the DC component of the reflected signal to the ADC 414. In some implementations, the filter 412 can be a RF block/DC pass filter. In other implementations, the filter 412 can be one or more filter capacitors arranged in a shunt configuration. It should be understood that the filter components described above are provided only as examples and that other types of filter components can be used. An ADC 414 can convert the signal, which is analog, into a digital signal. The digital signal can be transmitted to the controller (e.g., computing device 500 shown in FIG. 5) such as a vehicle controller for further processing. The ADC 414 can sample the voltage of the demodulated and filtered signal. Optionally, in some implementations, the ADC 414 is a low sampling rate ADC 414 that measures voltage as a function of time. Further, in some implementations, the ADC is a low-speed and low-cost ADC 414.

Figure 4B:
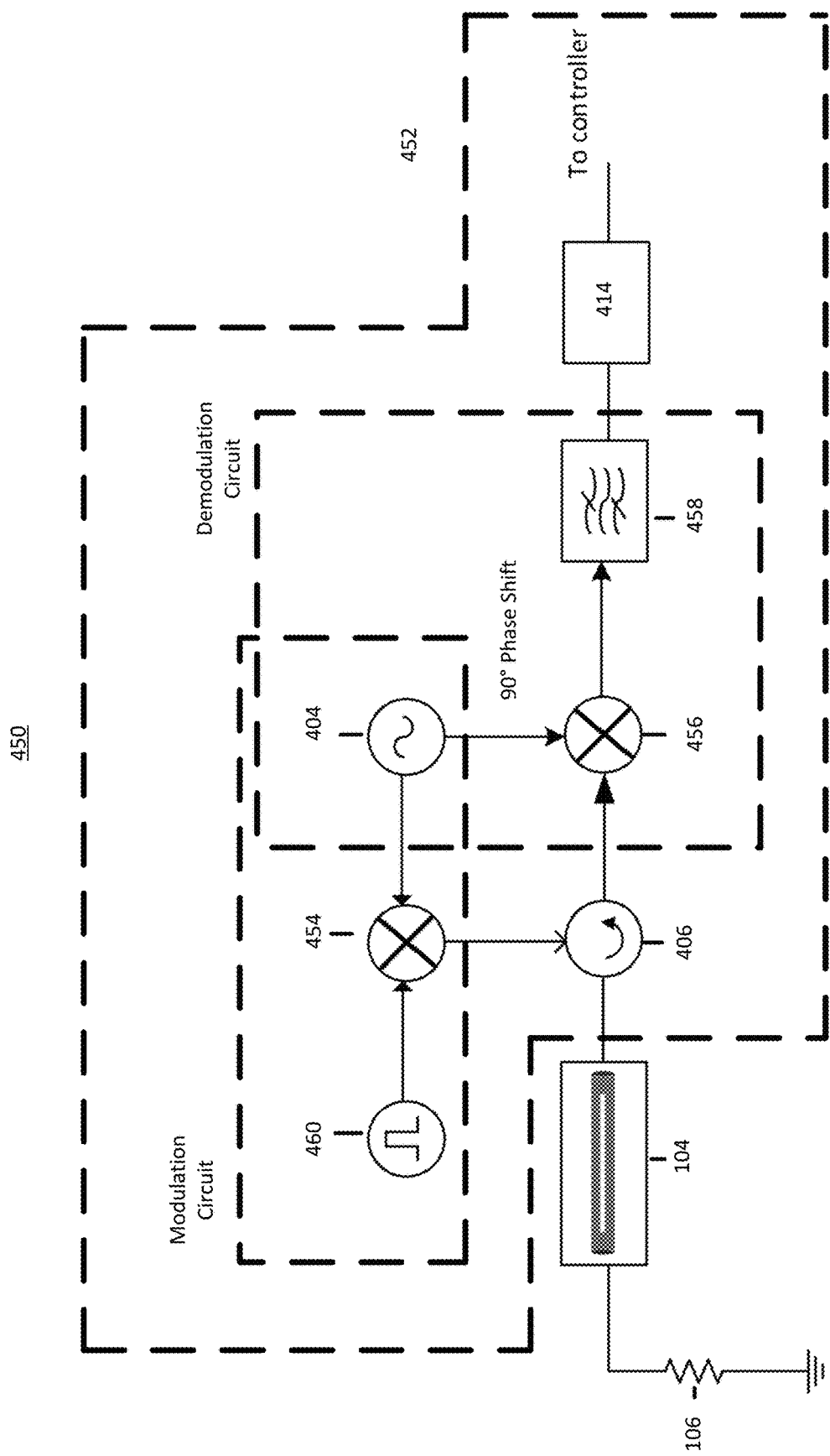

Referring now to FIG. 4B, a block diagram illustrating an example proximity sensor 450 and transceiver unit 452 is shown. The proximity sensor 450 is capable of determining both the presence and location of an object. Unlike the non-limiting example shown in FIG. 4A, the transceiver unit 452 shown in FIG. 4B does not convert the signal from the leaky coaxial cable 104 into a DC signal. The transceiver circuit 452 shown in FIG. 4B can detect both presence and location of an object (e.g., hand) placed in proximity to the proximity sensor. The transceiver unit 452 in FIG. 4B is configured to pass a signal based on the reflected signal for further processing by the controller (e.g., computing device 500 shown in FIG. 5). It should be understood that the transceiver unit 452 in FIG. 4B is provided only as an example.

As shown in FIG. 4B, the proximity sensor 450 includes a leaky coaxial cable 104, the transceiver unit 452, and a load 106. The leaky coaxial cable 104 and load 106 are described in detail above and therefore not described in further detail with regard to FIG. 4B. The transceiver unit 452 can include a Modulation Circuit and a Demodulation Circuit. The transceiver unit 452 is operably coupled to the load 106 via the leaky coaxial cable 104. The transceiver unit 452 includes a local oscillator 404, a circulator 406, a bandpass filter 458, a modulator 454, a demodulator 456, and an ADC 414. The circulator 406 can be a three-port device configured to ensure that a signal is transmitted in a single direction through the proximity sensor 400. The circulator 406 is operably connected between the leaky coaxial cable 104 and the transceiver unit 452. The circulator 406 is configured to pass the modulated input signal to the leaky coaxial cable 104 and pass the demodulates signal reflected by the leaky coaxial cable 104 to the transceiver unit 452. The local oscillator 404 can generate the carrier signal that is transmitted through the leaky coaxial cable 104. In the example shown in FIG. 4B, the local oscillator 404 is a 2.45 GHz voltage-controlled oscillator that is used to generate a 2.45 GHz carrier wave. However, in other implementations, different types of oscillators can be used, and different frequencies of carrier wave can be generated. The reflected signal is received by the transceiver unit 452. A modulator 454 is configured to receive signals including the signals from the oscillator 404 and the input signal 460. In some implementations, the input signal 460 is a 1 microsecond pulse. The modulator 454 is operably connected to a port of the circulator 406. The demodulator 456 is operably coupled to another port of the circulator 406. The demodulated signal output from the demodulator 456 is input into the bandpass filter 458. The filtered signal output from the bandpass filter 458 is then input into an ADC 414. The ADC 414 can convert the filtered signal, which is analog, into a digital signal. The digital signal can be transmitted to the controller (e.g., computing device 500 shown in FIG. 5) such as a vehicle controller for further processing. The ADC 414 can sample the voltage of the demodulated and filtered signal. Optionally, in some implementations, the ADC 414 is a low sampling rate ADC 414 that measures voltage as a function of time. Further, in some implementations, the ADC is a low-speed and low-cost ADC 414. Different types and configurations of modulation, demodulation, and filtering circuits are contemplated, and the block diagram illustrated in FIG. 4B is intended as a non-limiting example.

The arrangement, number, and order of the components in FIGS. 4A-4B are intended only as examples, and other configurations are contemplated. For example, implementations described herein can include more than one amplifier and/or more than one filter.

It should be appreciated that the logical operations described herein with respect to the various figures may be implemented (1) as a sequence of computer implemented acts or program modules (i.e., software) running on a computing device (e.g., the computing device described in FIG. 5), (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

Referring to FIG. 5, an example computing device 500 upon which the methods described herein may be implemented is illustrated. It should be understood that the example computing device 500 is only one example of a suitable computing environment upon which the methods described herein may be implemented. Optionally, the computing device 500 can be a well-known computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In its most basic configuration, computing device 500 typically includes at least one processing unit 506 and system memory 504. Depending on the exact configuration and type of computing device, system memory 504 may be volatile (such as random access memory (RAM)), non-volatile (such as read-only memory (ROM), flash memory, etc.), or some combination of the two. This most basic configuration is illustrated in FIG. 5 by dashed line 502. The processing unit 506 may be a standard programmable processor that performs arithmetic and logic operations necessary for operation of the computing device 500. The computing device 500 may also include a bus or other communication mechanism for communicating information among various components of the computing device 500.

Computing device 500 may have additional features/functionality. For example, computing device 500 may include additional storage such as removable storage 508 and non-removable storage 510 including, but not limited to, magnetic or optical disks or tapes. Computing device 500 may also contain network connection(s) 516 that allow the device to communicate with other devices. Computing device 500 may also have input device(s) 514 such as a keyboard, mouse, touch screen, etc. Output device(s) 512 such as a display, speakers, printer, etc. may also be included. The additional devices may be connected to the bus in order to facilitate communication of data among the components of the computing device 500. All these devices are well known in the art and need not be discussed at length here.

The processing unit 506 may be configured to execute program code encoded in tangible, computer-readable media. Tangible, computer-readable media refers to any media that is capable of providing data that causes the computing device 500 (i.e., a machine) to operate in a particular fashion. Various computer-readable media may be utilized to provide instructions to the processing unit 506 for execution. Example tangible, computer-readable media may include, but is not limited to, volatile media, non-volatile media, removable media and non-removable media implemented in any method or technology for storage of information such as computer readable instructions, data structures, program modules or other data. System memory 504, removable storage 508, and non-removable storage 510 are all examples of tangible, computer storage media. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processing unit 506 may execute program code stored in the system memory 504. For example, the bus may carry data to the system memory 504, from which the processing unit 506 receives and executes instructions. The data received by the system memory 504 may optionally be stored on the removable storage 508 or the non-removable storage 510 before or after execution by the processing unit 506.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

EXAMPLES

With the growth of Advanced Driver-Assistance Systems (ADAS) and Autonomous Driving Systems, it can be advantageous to monitor the presence of hands on the steering wheel for safety considerations. The example system described below includes a steering wheel sensor based on a leaky coaxial cable (LCX). For the readily embeddable steering wheel proximity sensor (as shown in FIGS. 3A-3B, also see [1], the presence of the hand and its position on the steering wheel can be transmitted to the vehicular controlling system, and based on this information, an instruction to the driver might be given to ensure driving safety.

An advantage of the LCX-based proximity sensor is its robustness when compared to regular capacitive proximity sensors [2]. Implementations of a proximity sensor described herein can detect the presence of a hand whether it is wet, dry, or even when the hand is enclosed by a glove. In addition, compared to some recently developed high sensitivity proximity sensors [3], the LCX sensor can be embedded into the steering wheel without major changes to the structure of the steering wheel. Although some novel piezoresistive film-based flexible force sensors [4] might be suitable to embed in a steering wheel, these sensors require physical contact. In turn, such sensors can fail when weak forces are exerted on the steering wheel. Accordingly, the LCX sensors described herein would have advantages of such piezoresistive film-based flexible force sensors.

The LCX has a history of being used in tunnel communication and intruder detection systems [5]-[8]. The basic propagation theory for LCX has been explained in early research work, both analytically and numerically [9]-[14]. It has been recognized that there are coaxial modes (or bifilar modes) and monofilar modes in the cable. While the bifilar modes confine most of their energy inside the cable, the monofilar modes have most of their energy on the surface of the cable with leakage. The work in [15] has illustrated the designing process of LCX for antenna use with different slot configurations. These patterns generally include periodic transverse slots, periodic inclined slots with same or different angles and a continuous axial slot.

However, all these papers are focused on the antenna properties such as the radiation and propagation characteristics of the LCX, e.g. coupling loss [12], [13], [15], radiation pattern [16], and radiation efficiency [12]. Implementations described herein include a steering wheel proximity sensor taking advantage of the LCX's near-field properties.

When an object with relatively high permittivity and/or conductivity, like the human hand, is placed near the LCX sensor, it disturbs the monofilar modes, producing a wave reflection back to the source. By measuring the time needed for the reflection to return to the source, the position of the object can be calculated. The sensitivity of the sensor is determined by the level of the reflected wave. Similar methods for time-domain reflectometry (TDR) have been widely used in the past for fault detection on electric cables [17]-[20]. Nevertheless, an implementation of the proximity sensor described herein involves more complicated reflected background signals given that the LCX is slotted and any discontinuities on the cable can lead to extra reflections.

In an example described herein, a numerical and experimental study was done for the LCX. To better understand the properties of the LCX sensor and optimize its design, a finite-difference time-domain (FDTD) numerical model was constructed. Based on the numerical results, a 3D-printed LCX sensor was fabricated and tested. The fabricated sensor was then used to validate the numerical model. Both the simulation and 3D-printed sensor were for a straight LCX sensor. To fit the actual steering wheel, an off-the-shelf flexible coaxial cable was modified based on the LCX sensor design and then embedded in a steering wheel included in a 2013 car model sold under the trademark ACURA MDX from Honda Motor Company of Hamamatsu, Shizuoka, Japan. Measurements and calculations were done to show the feasibility of this sensor.

Analysis on the Near-Field Attenuation by FDTD Method

FDTD Modeling

Figure 6B:
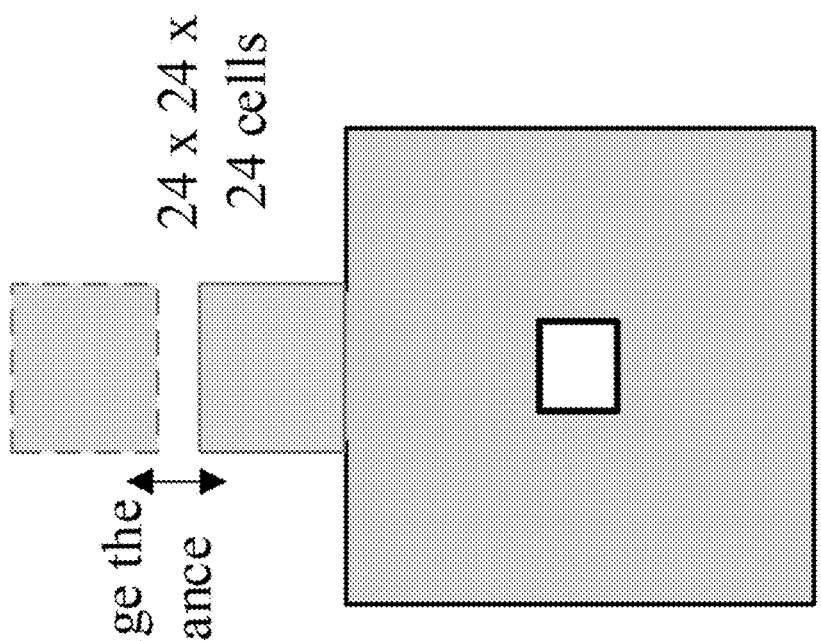
FIGS. 6A-6B are diagrams illustrating a cross-section view of FDTD configuration.
Figure 6A:
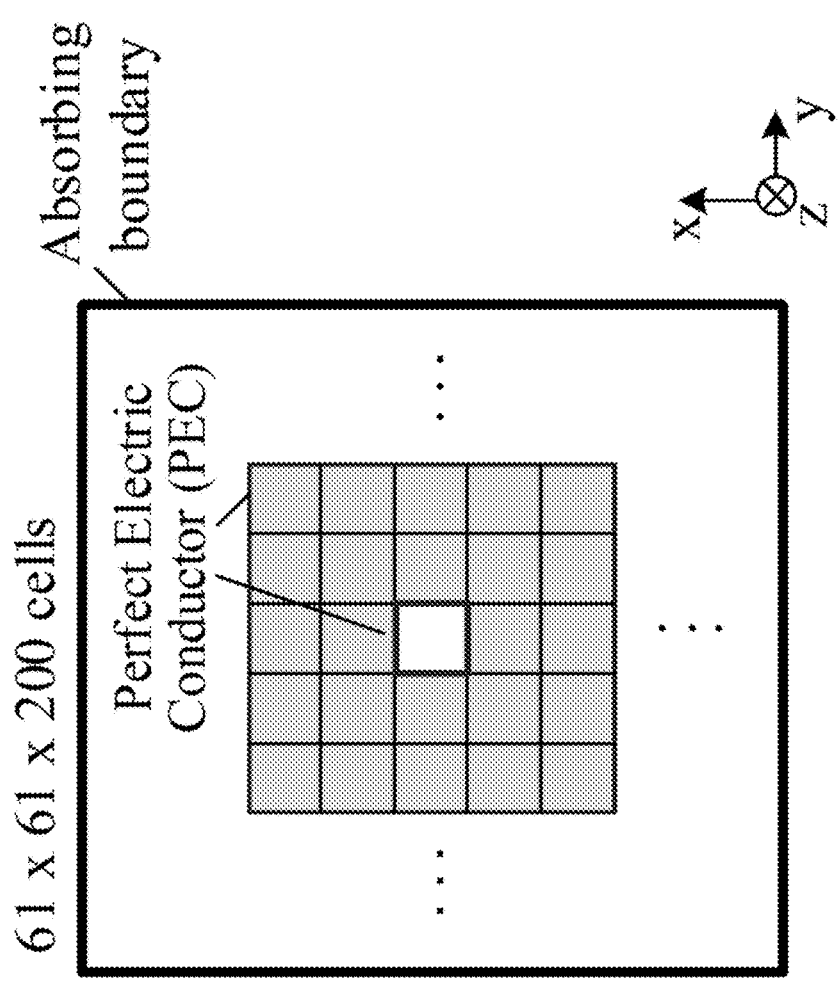

Because the standard FDTD method is done on a Cartesian grid, a simplified square cross-section LCX model is considered. FIG. 6A shows the cross-sectional grid for the LCX model. Each cell in the grid is a cube with side dimension of 2.5 mm. The grey region is the substrate for the leaky coaxial cable with relative permittivity chosen to be $\varepsilon_r=2.8$. Other regions are considered to be filled with air. FIG. 6B gives a simple illustration of how hand model positions may vary along the x-axis. In some of the later simulations, different hand locations are considered. The hand is modeled by a cube (6.0 cm sides) with $\varepsilon_r=25.7$, $\sigma=1.32$ S/m which follows the datasheet of a commercialized phantom POPEYE10 [21] and these data are published in [22]. For all regions mentioned above, Maxwell's curl equations are satisfied and can be expanded in Cartesian coordinates with central difference equation. Then Yee's mesh nodes [23] are applied to discretize time and space.

For boundary conditions, all perfect electric conductors (PEC's) marked in FIG. 6A have zero tangential electric field component. Mur's absorbing boundary condition (ABC) [24] has been applied to the outer boundary and two ends of the LCX as shown in FIG. 6B.

Figure 7:
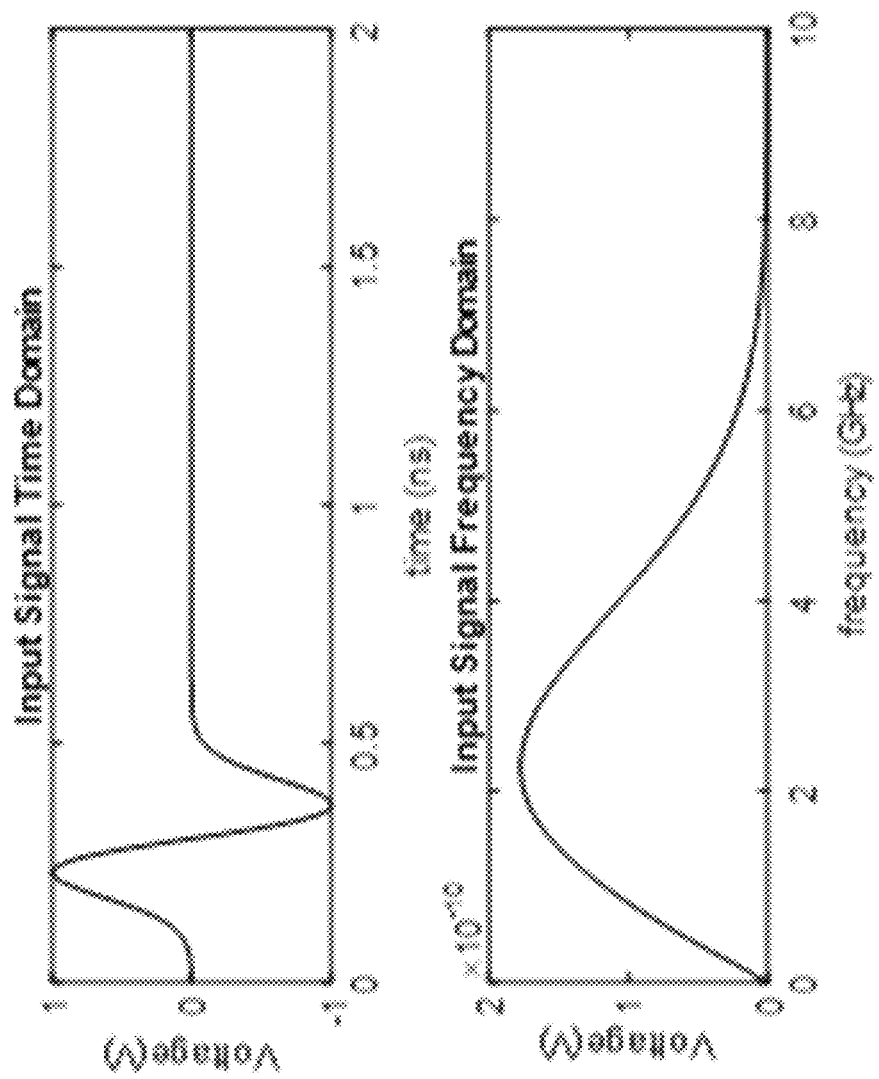
FIG. 7 illustrates the input signal time domain (top) and input signal frequency domain (bottom) according to an example described herein.

The input pulse used to excite the coaxial cable is the first derivative of a Gaussian pulse where the frequency content of the pulse is centered near 2.4 GHz. The voltage for this input pulse is given by:

$$V_s = N\left(-\frac{2t}{T_s^2} + \frac{6}{T_s}\right)e^{-\frac{(t-3T_s)^2}{T_s^2}}, \quad (1)$$

where $T_s$ controls the width of the pulse and is chosen to be 10^(−10) (unitless) so that most energy is centered around 2.4 GHz. In addition, N is a constant chosen to be 1.1696× 10^(−10) (unitless) so as to normalize the voltage peak to one volt. FIG. 7 shows both its time domain and frequency domain amplitude as a function of time and frequency, respectively.

Simulation Results

When a hand is placed near the LCX, it disturbs the fields within the coaxial line producing a reflected wave back to the source. By recording the time, the wave takes to travel back to the source, the location of the hand on the LCX can be determined if the speed of the wave is known. The field within the coaxial line is not a pure transverse electromagnetic (TEM) mode due to the presence of the slot. This can be viewed as a quasi-TEM wave. Although the speed of wave is not exactly the speed of light, it is close enough to get a good estimate of the position of the hand. Let $t_{delay}$ be the round-trip time it takes for the wave to travel from the source to the hand and then back. It can then be found from:

$$t_{delay} = \frac{2d\sqrt{\epsilon_r}}{c}. \quad (2)$$

In equation (2), d is the distance between hand and terminal and e, is the relative permittivity of the substrate of the LCX with c being the speed of light.

In FIGS. 8A-8D, the difference in the voltage between the hand and no-hand cases is plotted for various LCX slot configurations. This voltage difference is determined from the amplitude of the first reflected pulse. The geometry of the slot configurations with either a periodic slot or a continuous slot is shown in FIGS. 8A and 8B, respectively with the 'o' representing the width of the slot opening, 'l' representing the length of slot over one period for the periodic case, and 'p' representing the period length. In FIGS. 8C and 8D, the voltage difference is found as a function of hand distance from the LCX for various continuous slot and periodic slot configurations, respectively. For the simulation results illustrated in FIGS. 8C-8D, the width of the slot ranges from 15% of the cable circumference to 100%, where in FIGS. 8C-8D 100% corresponds to a completely unshielded cable. It can be seen that for the periodic slot cases, the voltage difference declines rapidly as the hand is moved farther from the LCX. Thus, these configurations may not be able to detect the hand on the steering wheel if the sensor is placed more than 2 mm from the surface of the steering wheel. In the case of the continuous slot, the voltage difference decreases at a much slower rate with hand distance from the LCX. Because of this behavior, the continuous slot case is chosen for this example described herein. It should be noted that choosing the widest slot may not be optimal in certain implementations since the sensor may unintentionally detect objects farther from the steering wheel such as other parts of the human body. Slot width can be adjusted in implementations described herein to maintain enough sensor sensitivity while limiting the sensor detection range.

3D Printed Leaky Coaxial Cable

Figure 9A:
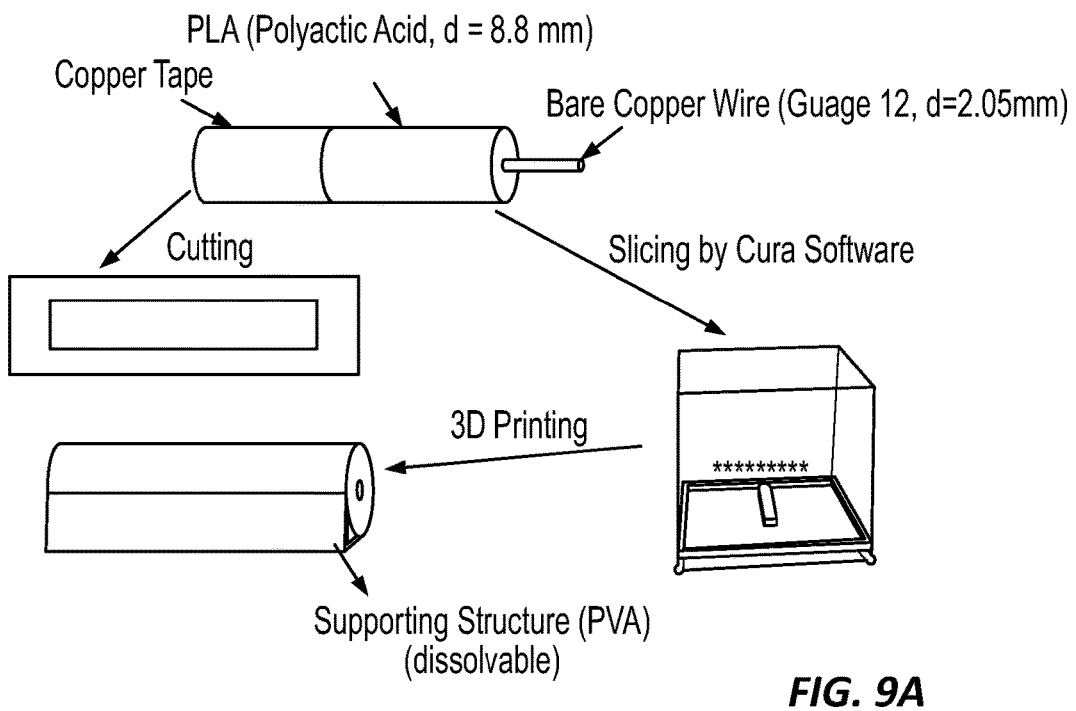
FIGS. 9A-9B illustrate leaky coaxial cable (LCX) configurations, where

An LCX includes three major parts: an inner conductor, a substrate and a slotted outer conductive shield. Here, a non-flexible coaxial substrate is 3D-printed using polylactide (∈,~2.8). A copper wire is inserted to serve as the inner conductor, and copper tape is wrapped around the cable to serve as the outer conductive shield (see FIGS. 9A and 9B). The process of 3D-printing the LCX substrate provides enhanced flexibility in the design (in terms of cable size and material properties) as compared to acquiring an off-the-shelf cable. The substrate is printed in 40 mm segments, so a total of 15 segments is used to create the LCX. The removable copper tape makes it possible to study numerous slot configurations of the LCX without having to create a new one. Based on the numerical results, only the continuous slot is considered in the examples below.

Figure 9B:
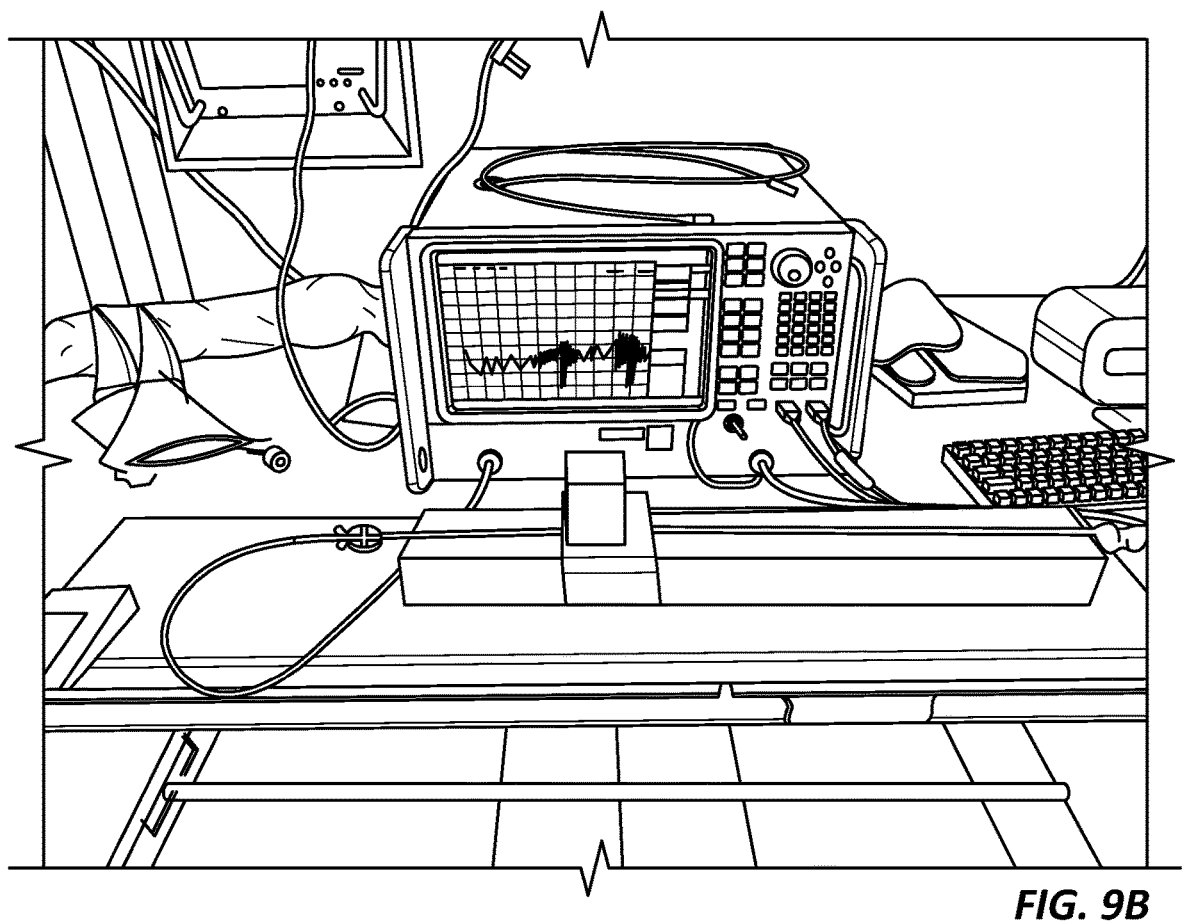

The fabricated LCX is fitted in a slot formed in a piece of foam sold under the trademark STYROFOAM as shown in FIG. 9B to isolate it from the lab bench and provide stability during measurements. A hand phantom represented by a 6 cm cube POPEYE10 [21] is used to emulate a hand. In addition, a stack of 1 mm and 5 mm thick sliced foam sold under the trademark STYROFOAM is prepared to maintain an accurate separation distance between the hand phantom cube and the slot of the LCX.

Comparison Between Numerical Results and Measurements

Since the numerical model has a square cross-section, which is different from the printed round cross-section cable, there might be some difference in the result. To minimize these differences, the cables are chosen to have the same characteristic impedance, substrate permittivity, and equivalent terminations. Table I in FIG. 10 shows the specifications between these two cables, i.e., the simulation model ("numeric cable") and the 3D-printed LCX cable. As shown in the table, both types of coaxial cables have the same characteristic impedance before and after slotting.

To validate the numerical model against measurements, a network analyzer is used to measure the S-parameters of the 3D-printed cable (FIG. 9B). The ratio of S with hand to without hand is calculated and is approximately equivalent to the ratio of reflected voltage with hand to without hand, which can be written as:

$$\frac{S_{11}^{hand}}{S_{11}^{no\_hand}} \approx \frac{V_{hand}^{ref}}{V_{no\_hand}^{ref}}, \quad (3)$$

Figure 11:
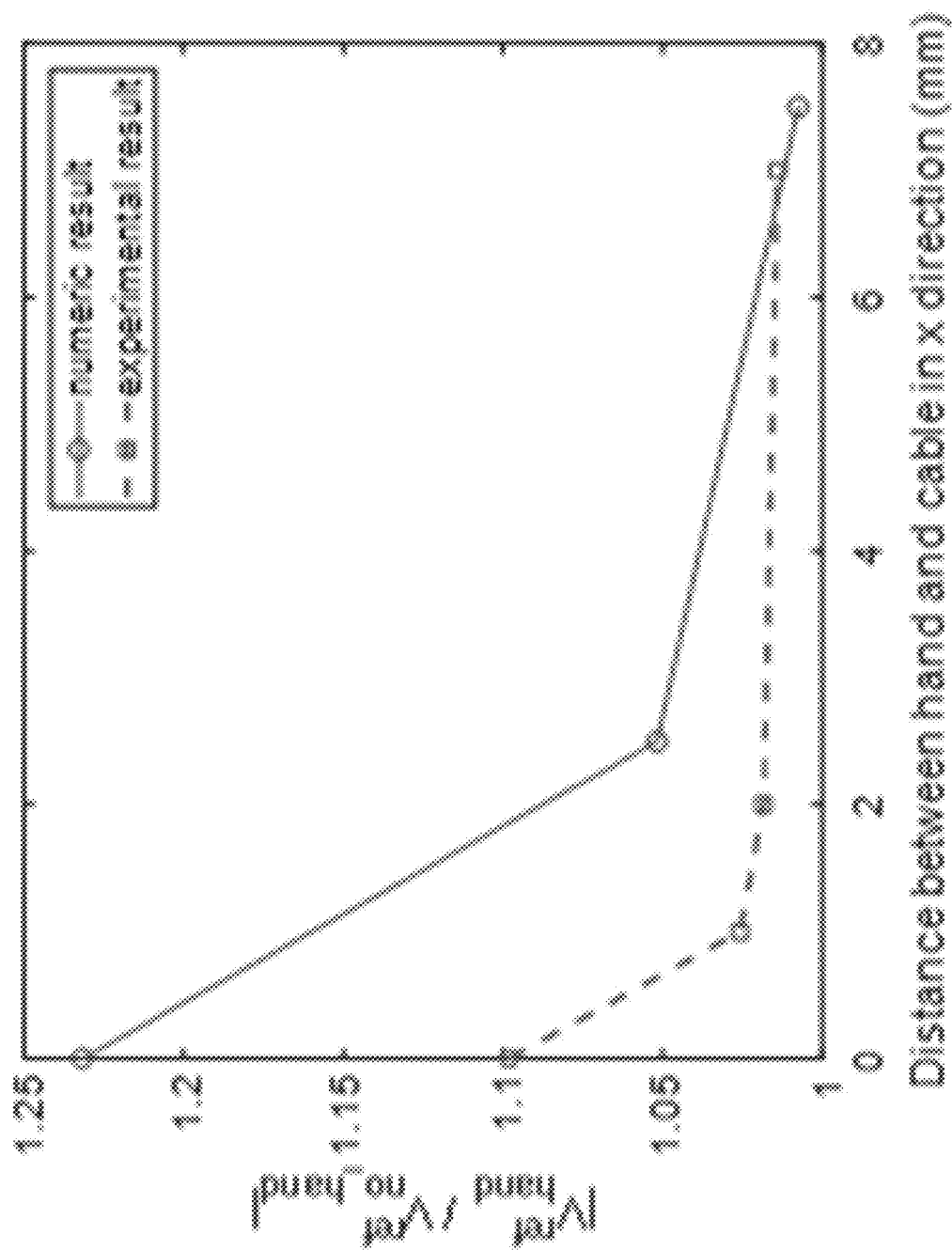
FIG. 11 illustrates the voltage ratio between hand on and hand off versus hand distance from the cables of FIG. 10 in the x-direction.

The comparison result between the numerical model and experimental model is shown in FIG. 11 at 800 MHz. Note that it is not possible to do the comparison at 2.4 GHz since the connector's poor performance at higher frequencies dominates the measurement results. The numerical and experimental curves in FIG. 11 are within 10% and are reasonable given the differences in the coaxial cable geometry.

Inverse Discrete Fourier Transform (IDFT)

Since the measurement result is obtained with a network analyzer, all the data are in the frequency domain. However, as demonstrated above, time-domain data might be more helpful to determine the hand position. An IDFT is used to process all S11 data as shown in FIG. 12.

Figure 12:
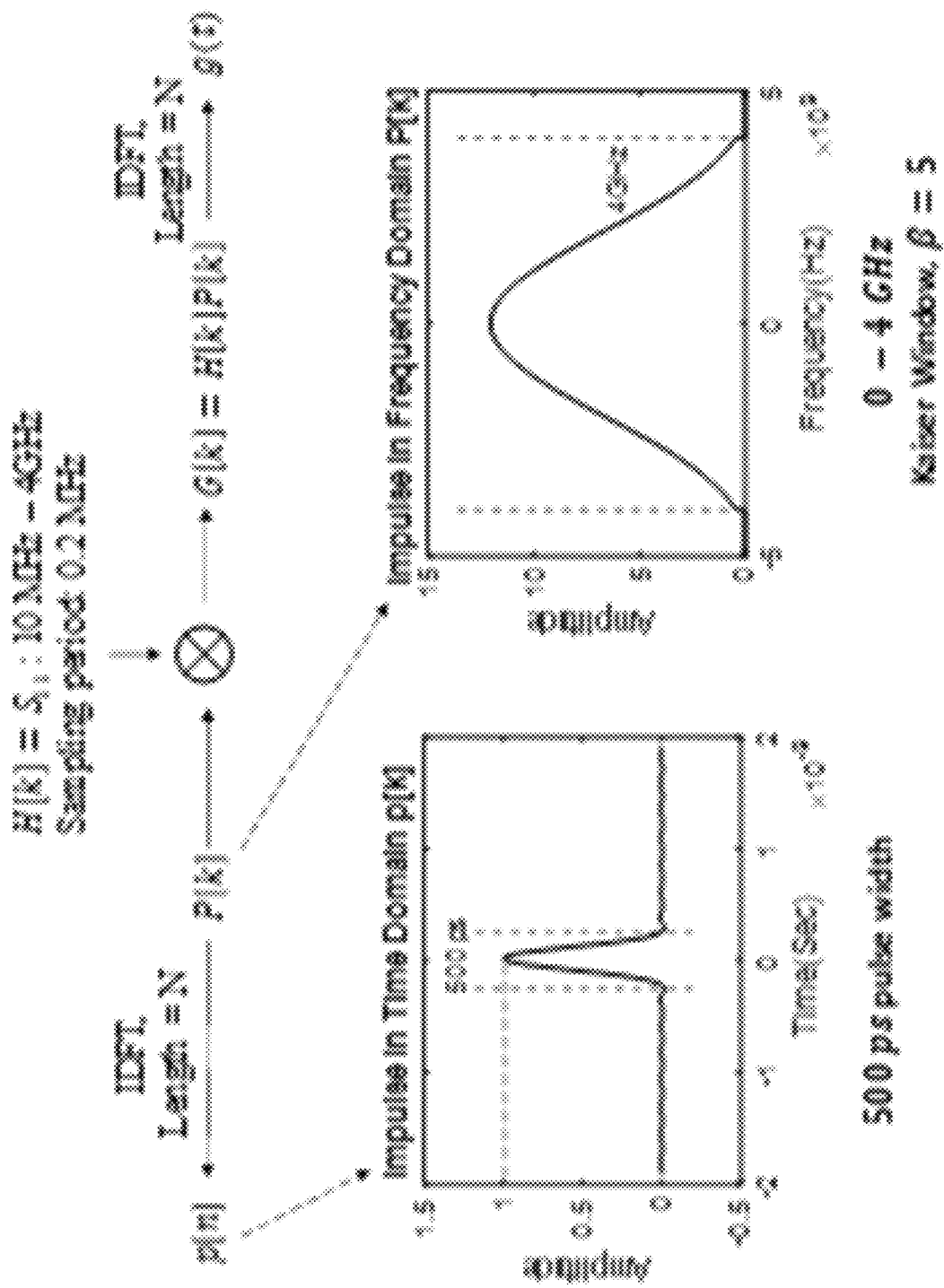
FIG. 12 Illustrates an impulse response in time domain by applying IDFT of multiplication of a 500 ps pulse and S11.

A time domain impulse response of the LCX is obtained based on the process of FIG. 12. In order to obtain a 500 ps pulse, a Kaiser window with β=5 is applied to truncate the pulse's frequency band to 0-4 GHz.

Figure 13A:
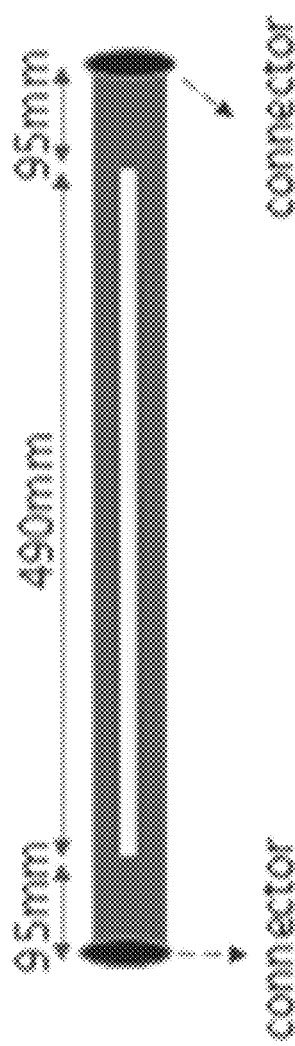
FIG. 13A illustrates a slot position on an LCX according to an implementation described herein.
Figure 13B:
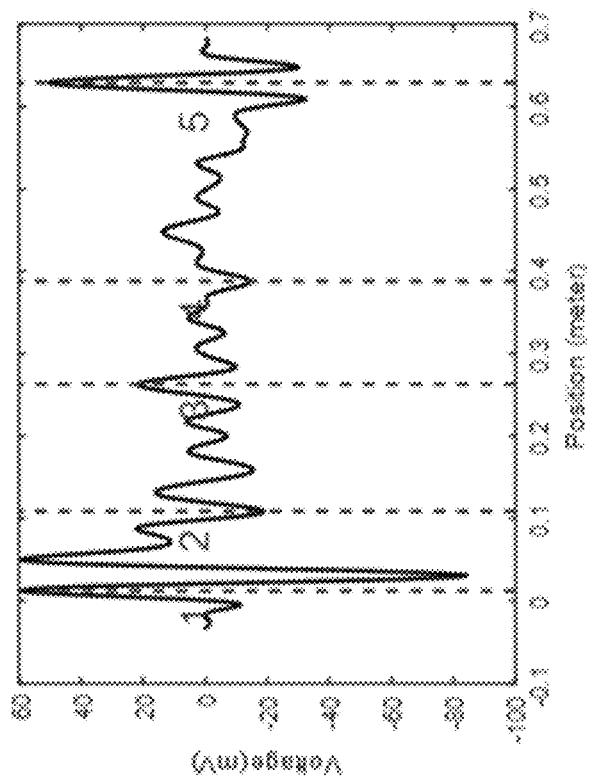
FIG. 13B illustrates impulse response in time domain for a continuous slot LCX with slot width of about 5 mm as shown in FIG. 13A.
Figure 15A:
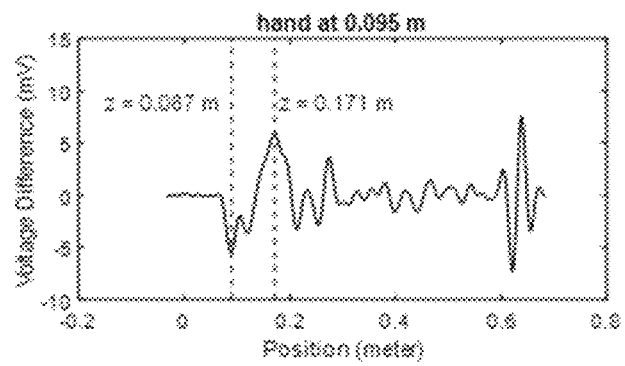
FIGS. 15A-15D illustrate the impulse response for a hand positioned on an LCX in at four different locations, where 0 m is defined at the connecter, according to an example described herein.
Figure 15B:
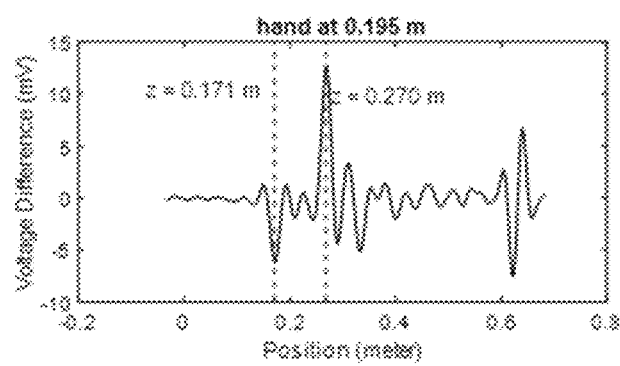
Figure 15C:
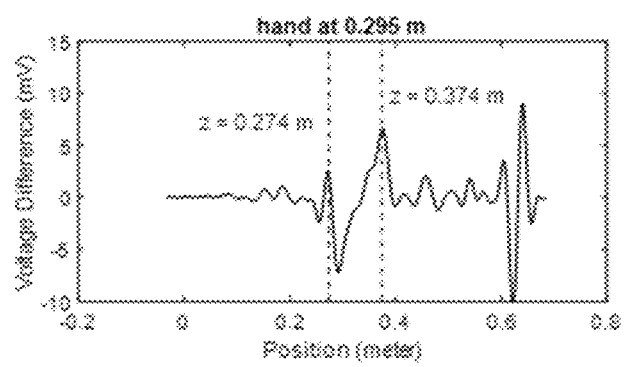
Figure 15D:
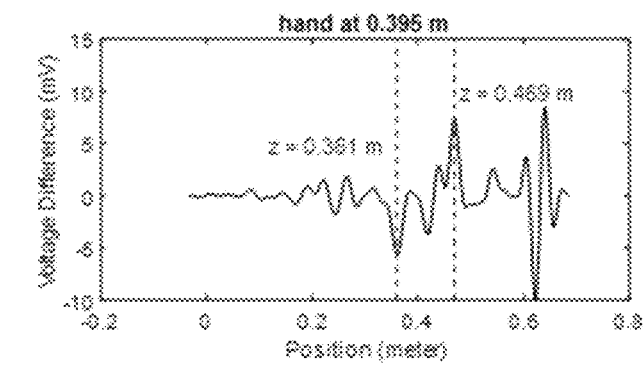

For the LCX with a continuous slot of width 5 mm shown in FIG. 13A, the time domain solution is shown in FIG. 13B where the x-axis is converted to distance instead of time with equation (2). The reflections due to the connectors and the start of the slot can clearly be seen in the figure. It is interesting that there are other large reflections in the LCX at the locations marked by 3 and 4 in FIG. 13B. A visual inspection of these two locations revealed obvious gaps between substrate sections due to inaccuracies in the printing process. Note that the distance between marker 1 and 5 in FIG. 13B is not the total length of the cable as shown in FIG. 13A of 0.68 meter. There are three major reasons for that. First, the 680 mm is measured from the left end to the right end so that the length of about 4 cm of the connectors themselves is also included. The major discontinuity (the peaks in FIG. 13B) caused by the connector is obviously not at the two ends but at the center of the connectors. Second, the x-axis of FIG. 13B has been calculated using Eq. (2), noting that the permittivity of the cable substrate is only an approximate value provided by the cable manufacturer. Third, since the input signal has a bandwidth of about 4 GHz, the theoretical distance resolution can only reach about 4.5 cm. Table II in FIG. 14 lists the discontinuities on the LCX which produces the peaks marked in FIG. 13B.

Hand Position Results

Measurements are taken with the hand placed on the cable shown in FIG. 13A at four different places. To measure the effect of the hand, the difference in amplitude of the reflected wave with and without the hand is calculated. The results are shown in FIGS. 15A-15D where the horizontal axis is displayed as position on the LCX rather than time. It should be noted that these experiments are done with a real hand instead of the phantom cube.

In FIGS. 15A-15D, the left and right boundaries of the hand are marked by the vertical dashed lines. The presence and location of the hand can be determined from FIGS. 15A-15D. It should be highlighted here that the marked reflection peaks are attributed to the discontinuity between an LCX segment with a hand on as opposed to the LCX segment without the hand on. That is, the reflection peaks occur at the beginning and ending of the hand, as attributes to characteristic impedance mismatch. As such, the width of a hand will not significantly affect the peak amplitude but rather the distance between the two peaks.

Comparison with Different Slot Configurations

Figure 16:
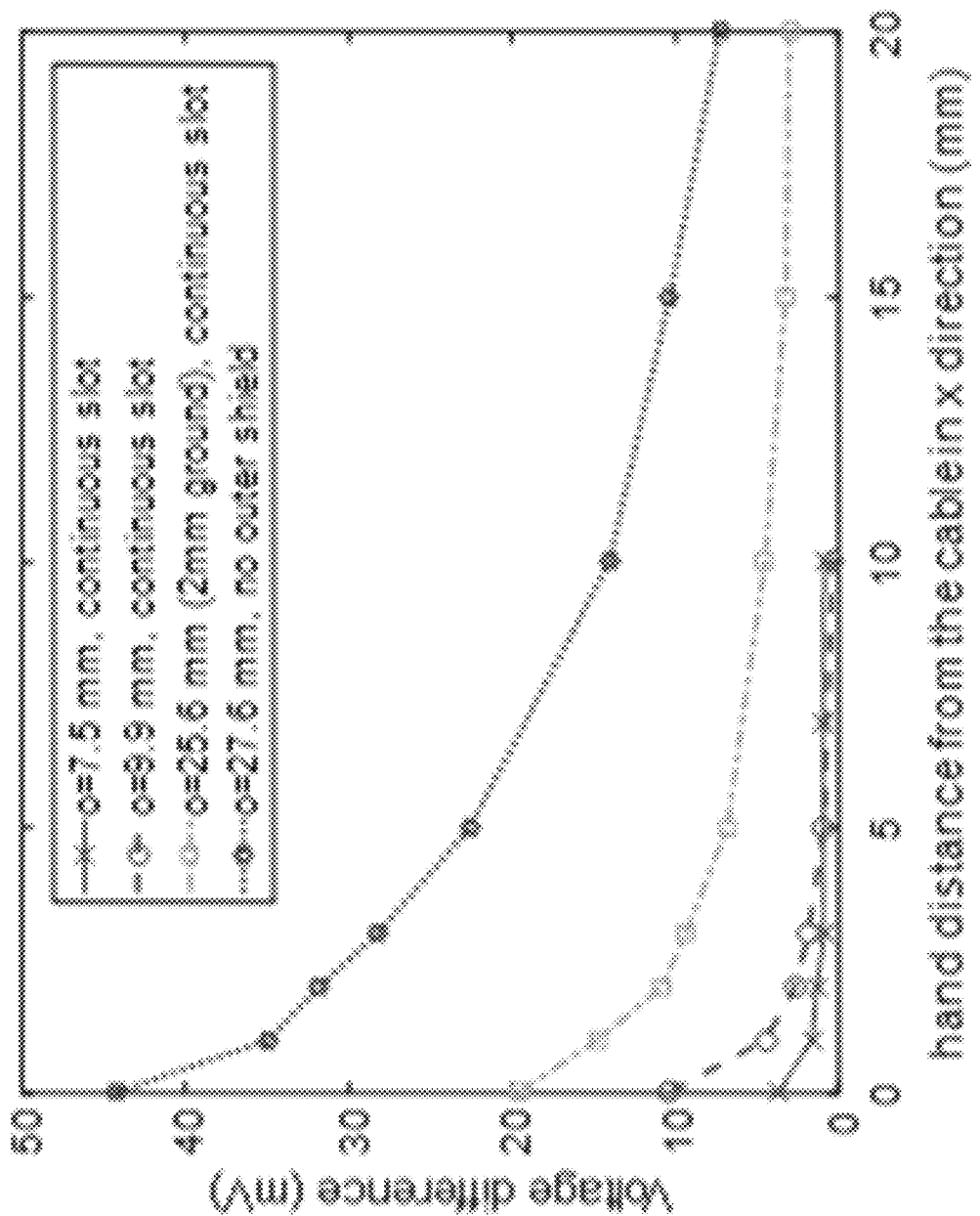
FIG. 16 illustrates a comparison of amplitude change with hand on and hand off between different slot configurations (o=7.5 mm, continuous slot; o=9.9 mm, continuous slot; o=25.6 mm (2 mm ground), continuous slot; and o=27.6 mm, no outer shield), according to an example described herein.

As discussed above, a continuous slot with a wider opening can help to increase the reflections due to the hand. To validate the findings in the numerical result and also to obtain data on a realistic LCX that does not assume the idealizations of the numerical model, the LCX with various slot widths including the case where the outer conductor is totally removed were constructed. The same IDFT technique is utilized to obtain the time-domain response. FIG. 16 shows the measurement results. The horizontal axis represents the distance between the hand and the LCX while the vertical axis represents the difference in the voltage of the first reflected pulse between the hand and no hand cases.

The choice of slot width should provide a high enough signal when the hand is a short distance away from the LCX to account for the placement of the LCX in the steering wheel as well as hand coverings such as gloves or mittens. At the same time, it should not be affected by objects too far away. For 3D-printed LCX, the two smaller widths are likely to be too small while the case where the cable has no outers shield [25],[26] totally changes the radiation behavior. Another disadvantage of having no outer shield is that the discontinuity at the beginning of the slot causes a large reflection, which decreases the portion of signal radiating from the slot. The results are used as guidance for the actual LCX discussed below.

Measurement and Analysis on an LCX Proximity Sensor Embedded to a Steering Wheel A prototype LCX embedded in a steering wheel was designed, fabricated and measured as described below. A suitable and feasible design for the prototype considers not only cable size and slot configurations but also cost and fabrication difficulty. The following specifications are considered Coaxial cable: The coaxial cable can be commercially available cable, which reduces costs. The cable can be flexible, easy to modify, and small enough to embed into the steering wheel. A 50 Ohms coaxial cable sold under the trademark LMR-240 is chosen for the example described herein [27].

Slot type: Based on the numerical results, the continuous slot configuration has more advantages than the periodic slot configuration for this application. For example, the periodic slot configuration is more difficult to fabricate. Additionally, previous research [13] has already shown that the near-field distribution of electromagnetic field for the periodic slot configuration is not uniform along the axial direction, which leads to greater uncertainty in selecting a detection threshold for the presence of a hand.

Slot size: As discussed above, a wider slot gives more leakage of the electromagnetic wave, resulting in a greater reflected. Based on the previous results and some testing of the LCX, a slot width equal to half (6 mm) the circumference of the outer conductor is chosen.

Embedded LCX Prototype

Figure 17:
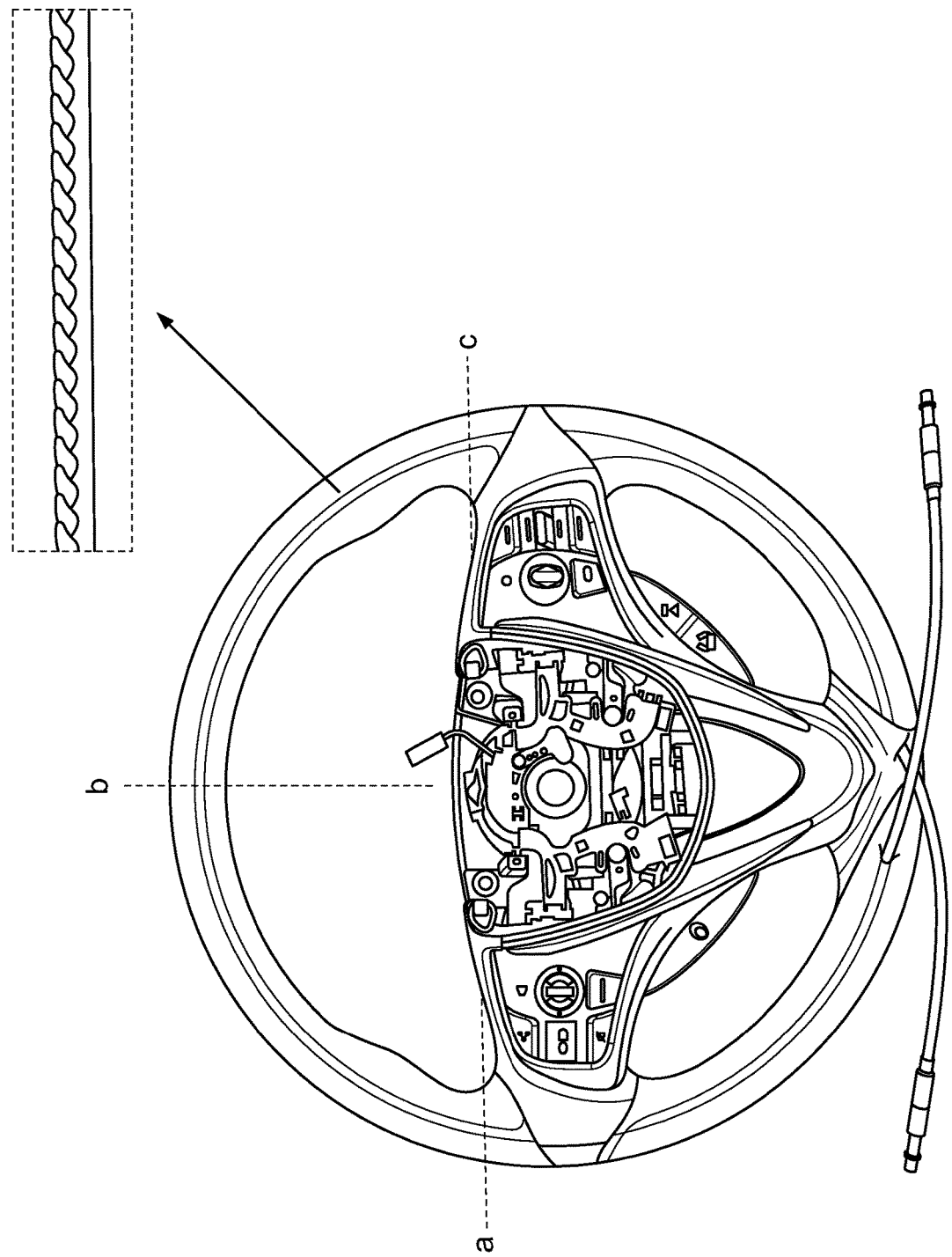
FIG. 17 illustrates an LCX proximity sensor based on a coaxial cable sold under the trademark LMR-240 by Times Microwave Systems, Inc. of Wallingford, Conn. embedded in a steering wheel.

The LCX is embedded in the steering wheel of a 2013 car sold under the trademark ACURA MDX as shown in FIG. 17. Three different positions on the steering wheel 'a', 'b' and 'c' are also marked in FIG. 17 for later measurement usage. To place the LCX in the steering wheel, a part of the foam of the steering wheel is removed. Then the heating mat and leather layers are pulled back from the steering wheel, and the LCX is placed beneath these two layers. A foam tape is used to fix the LCX to the hub core of the steering wheel, and the heating mat and leather are the placed back over the LCX.

Measurement

A vector network analyzer is connected to the two ports of the embedded LCX. The same IDFT technique described above is also applied to obtain the impulse response of the sensor in the time domain. The S-parameters of hand holding the steering wheel at different positions are recorded and processed.

Experimental Results

Figure 18:
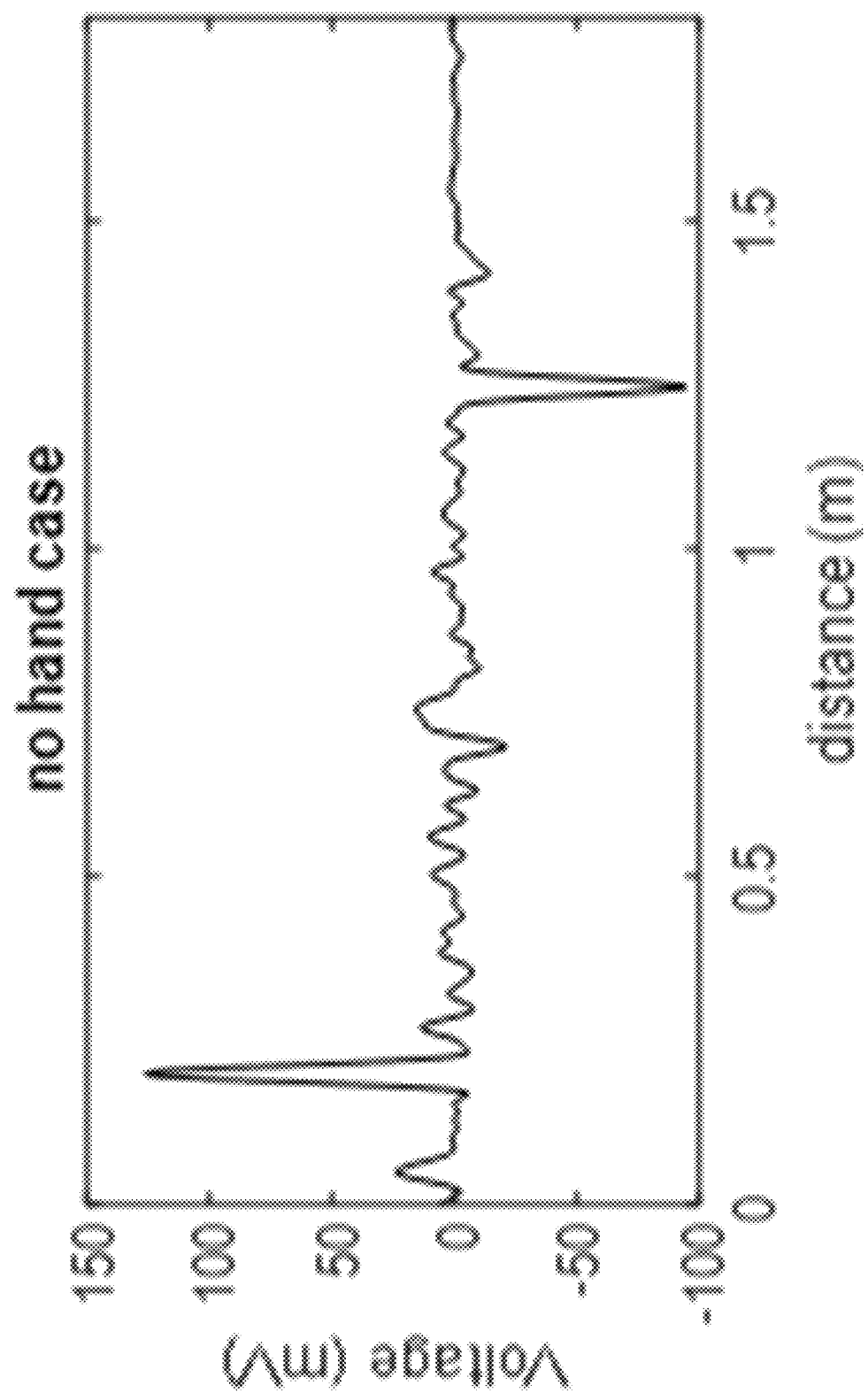
FIG. 18 illustrates a time-domain impulse response of a "no hand" case for the steering wheel of FIG. 17.
Figure 19A:
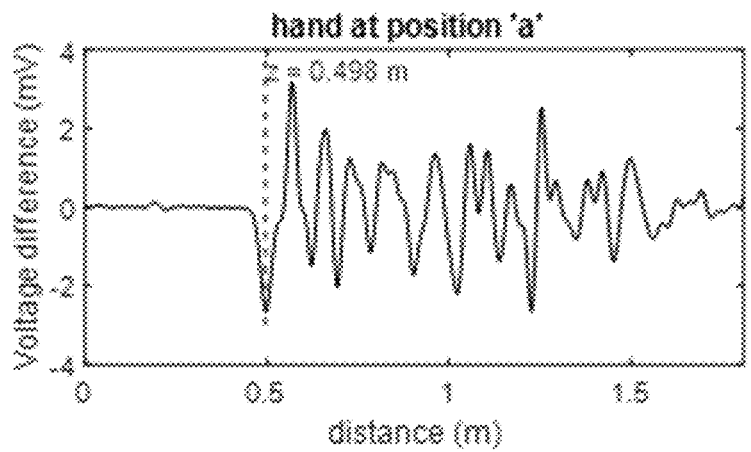
FIGS. 19A-19C illustrate a measurement of amplitude difference between with hand on at different positions (i.e., positions 'a,' 'b,' and 'c') and hand off for the steering wheel of FIG. 17.
Figure 19B:
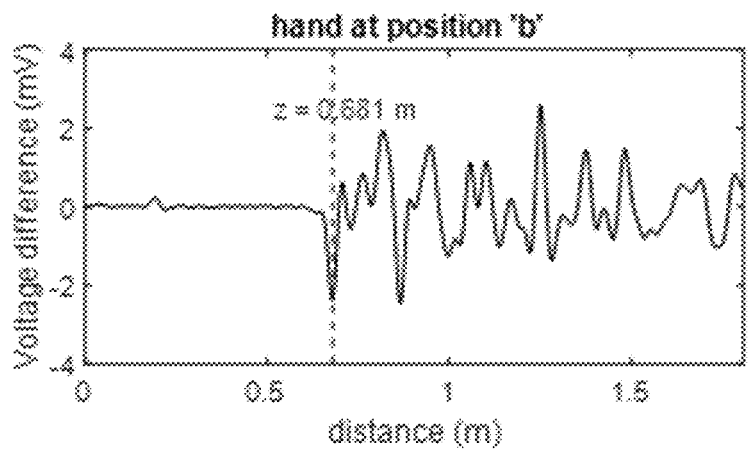
Figure 19C:
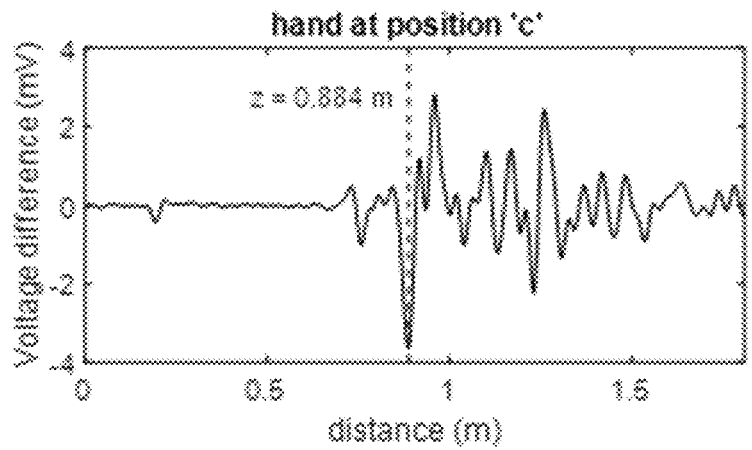

The time-domain impulse responses of "no hand" case is shown in FIG. 18 and the amplitude differences between with and without the hand are shown in FIGS. 19A-19C for three different hand positions on the steering wheel. The approximate positions on the steering wheel are marked in FIG. 17. Similar to previous results, the horizontal axis is converted from time to position on the LCX. Position 'a' is approximately 0.5 m from the beginning of the LCX, and the spacing between positions 'a', 'b' and 'c' is about 0.2 m, which coincides with the results shown in FIGS. 19A-19C.

The average amplitude of the difference is around 2 mV, which is smaller than the values in described above for the 3D printed LCX. There are many possible reasons for the discrepancy since the two cables are not the same. First, the coaxial cable sold under the trademark LMR-240 is much smaller than the 3D printed LCX; therefore, a smaller amplitude is expected. Second, the amplitude may be affected by the presence of the heating mat and leather between the LCX and the hand. Also, the LCX is now stretched along a circle rather than being straight.

Figure 20A:
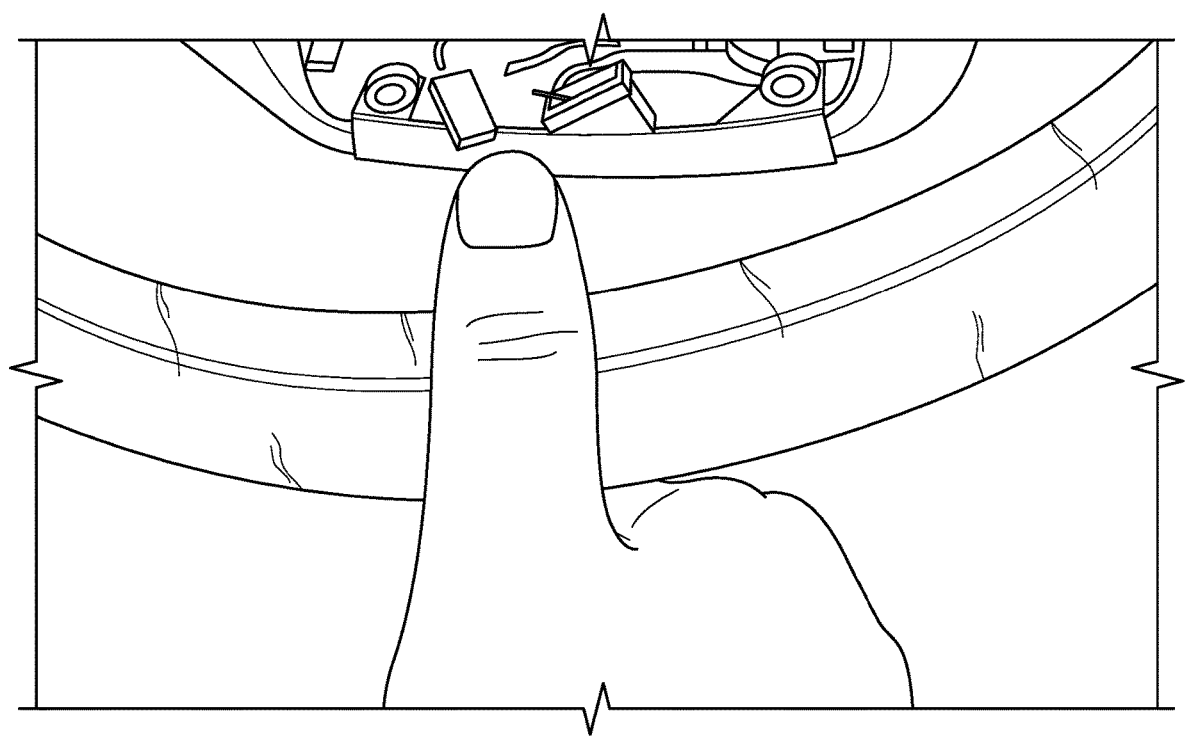
FIG. 20A illustrates a single finger placed on the steering wheel of FIG. 17.
Figure 20B:
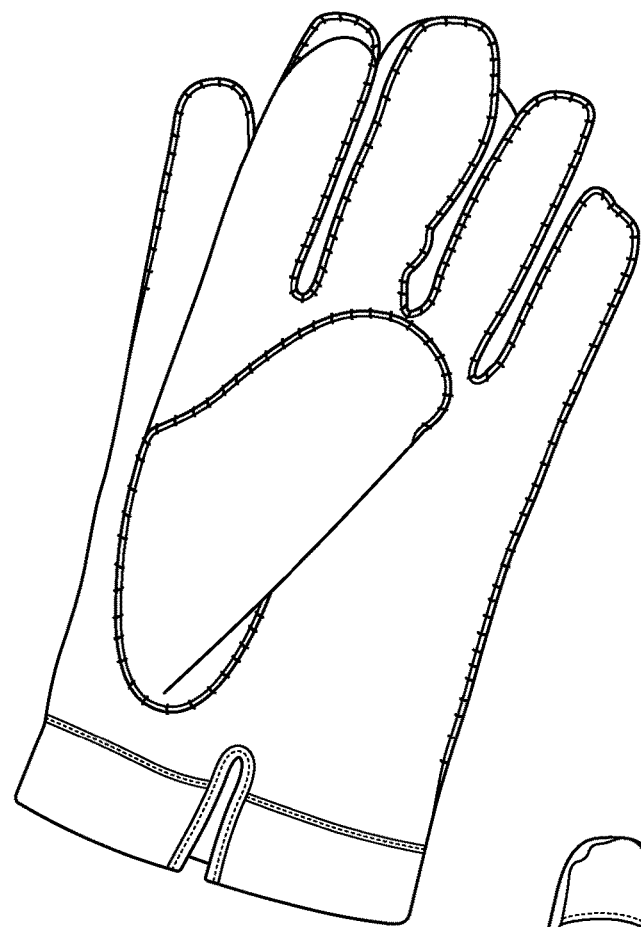
FIG. 20B illustrates a leather glove.
Figure 20C:
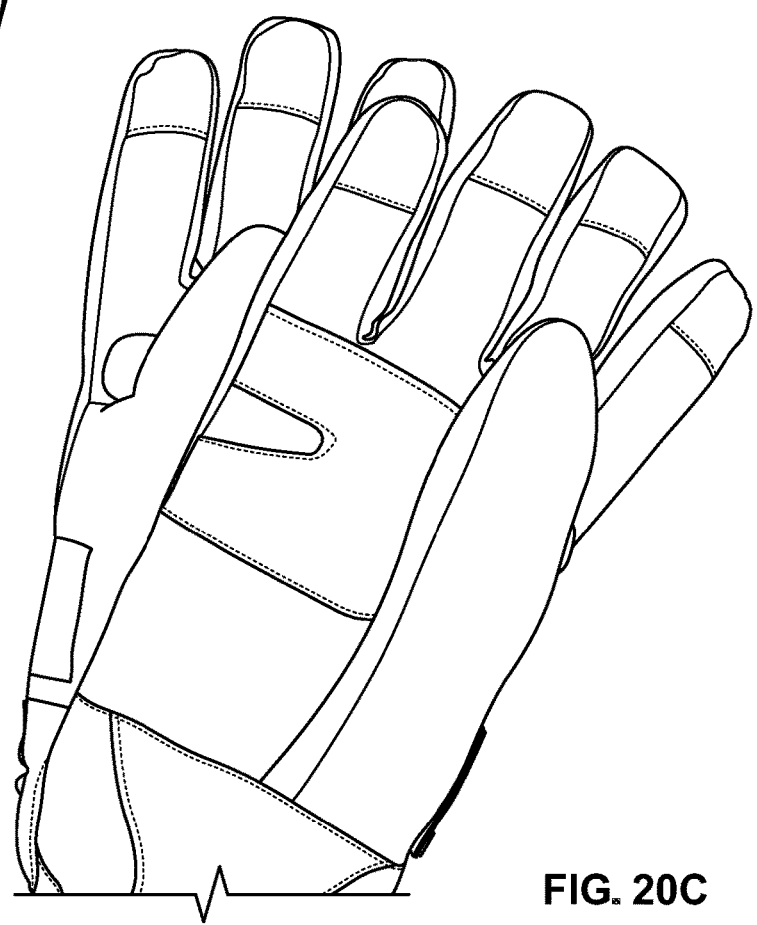
FIG. 20C illustrates a pair of winter gloves. A hand wearing the gloves of FIGS. 20B and 20C can be placed on the steering wheel of FIG. 17 as described herein.
Figure 21A:
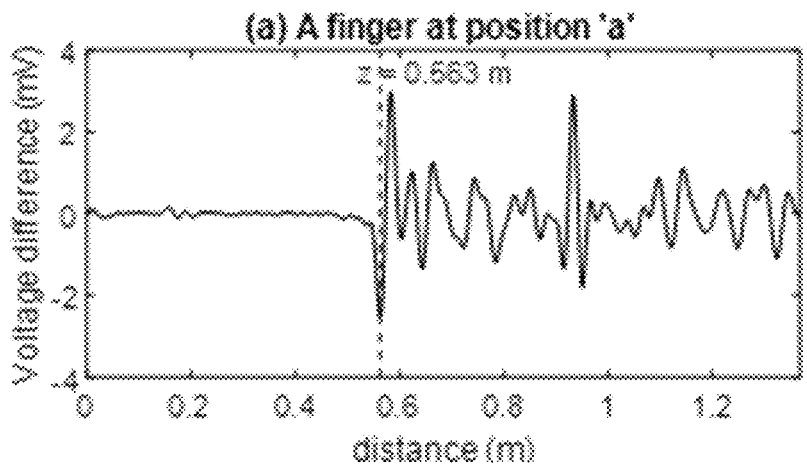
FIGS. 21A-21C illustrate the voltage amplitude difference between three kinds of contact at position 'a' on the steering wheel of FIG. 17 and the "no hand" case, according to an example described herein.
Figure 21B:
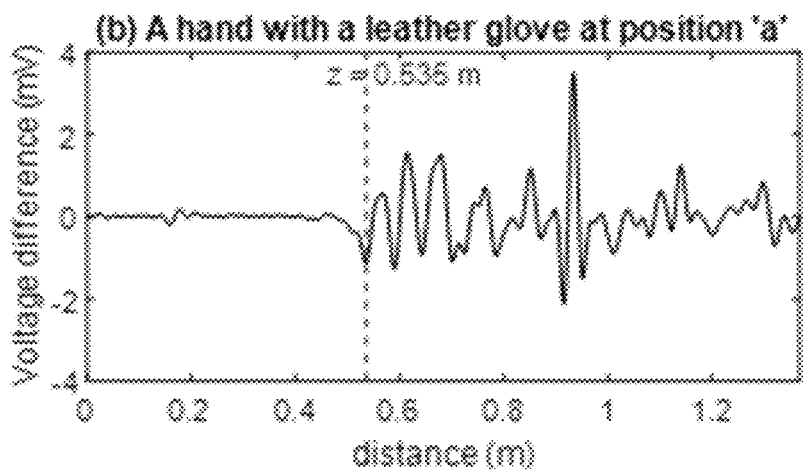
Figure 21C:
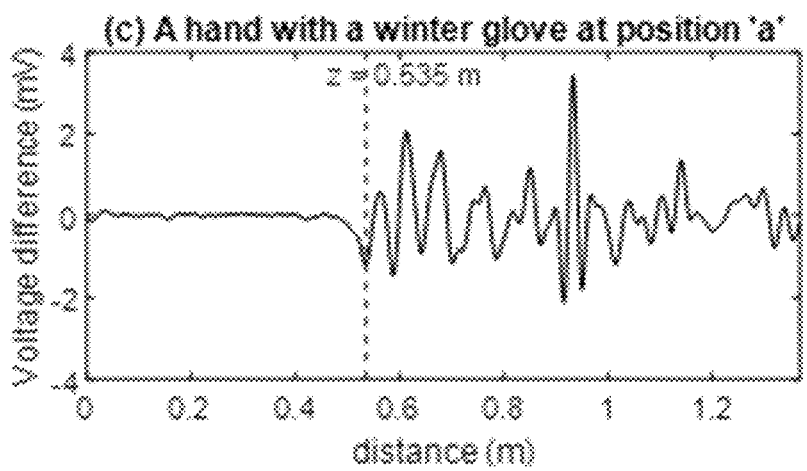

Additional results for placement upon the steering wheel of a single finger (see FIG. 20A), a hand wearing a leather glove (see FIG. 20B), and a hand wearing a winter glove (see FIG. 20C) are given in FIGS. 21A-21C, respectively. Measurements for these cases have been repeated twice and the voltage difference between the two has been found to be within 10%. For a single finger placed on the steering wheel, FIG. 21A shows that the first peak value is approximately 105% of the whole hand case in FIGS. 19A-19C. Regarding FIG. 21B and FIG. 21C, it is noted that the winter glove is thicker than the leather glove but mostly filled with air-like material. As such, for the leather glove, the voltage difference drops to about 47% of the amplitude difference of a bare hand. For the winter glove, it is about 48% of the bare hand case. That is, the peaks of voltage differences in FIGS. 21B and 21C are 1.24 mV and 1.27 mV, as opposed to 2.64 mV in FIG. 19A for the bare hand case. This drop off is not due to the glove itself. It is due to the greater separation between the sensor and the hand. This is shown in the results illustrated in FIG. 11 where the voltage difference drops significantly as the hand is moved from touching the sensor to being 3 mm away. The curve is relatively flat as the hand moves from 3 mm to 10 mm (except for the no-shield case). The presence of the glove creates a greater separation resulting in a smaller voltage difference but having winter gloves or leather gloves does not affect the results much because the hand separation is now on the flat part of the curve. Nevertheless, these values are still large enough to be identified from the background noise.

CONCLUSION

Numerical and experimental results confirm the feasibility of the use of the LCX as a steering wheel sensor. Different design parameters are studied to see how they affect the near-field wave distribution and performance of the sensor. The LCX embedded in a regular automobile's steering wheel is successfully tested with a network analyzer over frequency band from 10 MHz to 4 GHz. Hand position information is easily obtained by the reflected pulse in the time domain considering several different scenarios. Note that the network analyzer is working at very low power of about −10 dBm which conforms with the Specific Absorption Rate (SAR) guidelines imposed by the Federal Communications Commission (FCC). Therefore, the electromagnetic safety issues are overcome since the real energy exposed to the outside of cable is even less.

Measurements reported in this work are carried out via a network analyzer. This disclosure contemplates that low-cost ultra-wide band (UWB) transceiver circuits can be employed instead. In general, to obtain a spatial resolution of 10 cm in a LCX mentioned above, the circuit should be able to generate and detect a 790 ps (or shorter) pulse in the time domain. This implies about 1.26 GHz bandwidth in the frequency. These specifications can be implemented using a very small-scale impulse radar ultra-wideband (IR-UWB) transceiver circuit [28]. Note that since repetitive pulses are used in this kind of circuit, a long-enough dead time (time interval between two adjacent pulses) can be chosen. For example, for a steering wheel with a circumference of ~1.2 m, the dead time should be >9.6 ns which is the time needed for the wave to travel a round trip across the steering wheel's length. Moreover, to detect two hands on a steering wheel, two transceiver circuits can be placed at each end of the LCX, respectively. In this case, each transceiver circuit can only be responsible for detecting the hand nearest to itself.

To achieve simpler circuitry, this disclosure contemplates using some frequency-domain or time-domain methods [29], [30] to further narrow the frequency band required. Signal processing techniques like TDR, frequency-domain reflectometry (FDR) [31], and pulse compression [32] which have long been applied to fault detection for wires can be applied to improve the sensor's detection accuracy.

REFERENCES

[1] Honda Research & Development Americas Inc., Internal Communication, October 2018.
[2] Z. Chen and R. C. Luo, "Design and implementation of capacitive proximity sensor using microelectromechanical systems technology," IEEE Transactions on Industrial Electronics, vol. 45, no. 6, pp. 886-894, December 1998.
[3] Y. Ye, C. He, B. Liao and G. Qian, "Capacitive Proximity Sensor Array with a Simple High Sensitivity Capacitance Measuring Circuit for Human-Computer Interaction," IEEE Sensors Journal, vol. 18, no. 14, pp. 5906-5914, 15 Jul. 15, 2018.
[4] B. Lee and H. Shin, "Feasibility Study of Sitting Posture Monitoring Based on Piezoresistive Conductive Film-Based Flexible Force Sensor", IEEE Sensors Journal, vol. 16, no. 1, pp. 15-16, 2016.
[5] D. J. Martin, "Radio communication in mines and tunnels," Electron. Lett., No 6, pp. 563-564, 1970.
[6] P. Delongne and L Deryck, "Underground use of a coaxial cable with leaky sections," IEEE Trans. Antennas Propagat., vol. AP-28, pp. 875-883, November 1980.
[7] K. Inomata, T. Hirai, K. Sumi and K. Tanaka, "Wide-area Surveillance Sensor with Leaky Coaxial Cables," 2006 SICE-ICASE International Joint Conference, Busan, pp. 959-963, 2006.
[8] H. Xu et al., "A High-Resolution Leaky Coaxial Cable Sensor Using a Wideband Chaotic Signal", Sensors, vol. 18, no. 12, p. 4154, 2018.
[9] R. A. Hurd, "The modes of an axially slotted coaxial waveguide," Radio Science, vol. 14, no. 5, pp. 741-751, September-October 1979.
[10] P. P. Delogne and A. A. Laloux, "Theory of the Slotted Coaxial Cable," IEEE Transactions on Microwave Theory and Techniques, vol. 28, no. 10, pp. 1102-1107, October 1980.
[11] E. E. Hassan, "Field solution and propagation characteristics of monofilar-bifilar modes of axially slotted coaxial cable," IEEE Transactions on Microwave Theory and Techniques, vol. 37, no. 3, pp. 553-557, March 1989.
[12] S.-T. Kim, Gi-Ho Yun and Han-Kyu Park, "Numerical analysis of the propagation characteristics of multiangle multislot coaxial cable using moment method," IEEE Transactions on Microwave Theory and Techniques, vol. 46, no. 3, pp. 269-279, March 1998.
[13] J. H. Wang and K. K. Mei, "Theory and analysis of leaky coaxial cables with periodic slots," IEEE Transactions on Antennas and Propagation, vol. 49, no. 12, pp. 1723-1732, December 2001.
[14] D. H. Kim and H. J. Eom, "Radiation of a Leaky Coaxial Cable with Narrow Transverse Slots," IEEE Transactions on Antennas and Propagation, vol. 55, no. 1, pp. 107-110, January 2007.

[15] J. H. Wang and K. K. Mei, "Design of leaky coaxial cables with periodic slots," Radio Science, vol. 37, no. 5, pp. 1-10, October 2002.

[16] J. H. Wang, "Research on the Radiation Characteristics of Patched Leaky Coaxial Cable by FDTD Method and Mode Expansion Method," IEEE Transactions on Vehicular Technology, vol. 57, no. 1, pp. 90-96, January 2008.

[17] L Van Biesen, J. Renneboog and A. Barel, "High accuracy location of faults on electrical lines using digital signal processing", IEEE Transactions on Instrumentation and Measurement, vol. 39, no. 1, pp. 175-179, 1990.

[18] Y. Shin et al., "Application of Time-Frequency Domain Reflectometry for Detection and Localization of a Fault on a Coaxial Cable", IEEE Transactions on Instrumentation and Measurement, vol. 54, no. 6, pp. 2493-2500, 2005.

[19] A. Cozza and L Pichon, "Echo Response of Faults in Transmission Lines: Models and Limitations to Fault Detection", IEEE Transactions on Microwave Theory and Techniques, vol. 64, no. 12, pp. 4155-4164, 2016.

[20] J. Zhang, Y. Zhang and Y. Guan, "Analysis of Time-Domain Reflectometry Combined With Wavelet Transform for Fault Detection in Aircraft Shielded Cables", IEEE Sensors Journal, vol. 16, no. 11, pp. 4579-4586, 2016.

[21] SPEAG, Schmid & Partner Engineering AG. [online] Available at: https://speag.swiss/products/em-phantoms/phantoms/popeye-v10/.

[22] C. Gabriel, "Tissue Equivalent Material for Hand Phantoms," Physics in Medicine and Biology, 52 (2007), pp. 4205-4210.

[23] K. Yee, "Numerical solution of initial boundary value problems involving Maxwell's equations in isotropic media," IEEE Transactions on Antennas and Propagation, vol. 14, no. 3, pp. 302-307, May 1966.

[24] G. Mur, "Absorbing Boundary Conditions for the Finite-Difference Approximation of the Time-Domain Electromagnetic-Field Equations," IEEE Transactions on Electromagnetic Compatibility, vol. EMC-23, no. 4, pp. 377-382, November 1981.

[25] R. Lee and D. G. Dudley, "Electromagnetic coupling by a wire through a circular aperture in an infinite planar screen," Journal of Electromagnetic Waves and Applications, vol. 3, no. 4, pp. 284-305, 1989.

[26] R. Lee and D. G. Dudley, "Transient current propagation along a wire penetrating a circular aperture in an infinite planar conducting screen," IEEE Transactions on Electromagnetic Compatibility, vol. 32, no. 2, pp. 137-143, May 1990.

[27] Times microwave systems (2019). [online] Available at: https://www.timesmicrowave.com/DataSheets/Cable-Products/LMR-240-UF.pdf.

[28] J. Park, J. Jang, G. Lee, H. Koh, C. Kim and T. Kim, "A Time Domain Artificial Intelligence Radar System Using 33-GHz Direct Sampling for Hand Gesture Recognition", IEEE Journal of Solid-State Circuits, vol. 55, no. 4, pp. 879-888, 2020.

[29] K. Z. Jadoon, S. Lambot, E. C. Slob H. Vereecken "Analysis of horn antenna transfer functions and phase-center position for modeling off-ground GPR" IEEE Trans. Geosci. Remote Sens., vol. 49 no. 5 pp. 1649-1662, May 2011.

[30] J. Che, C. Chen, L. G. Stolarczyk and J. T. Duncan, "Novel In Situ Boundary Detection Algorithm for Horizon Control in Longwall Mining," IEEE Geoscience and Remote Sensing Letters, vol. 14, no. 10, pp. 1875-1879, October 2017.

[31] H. Vanhamme, "High resolution frequency-domain reflectometry," IEEE Transactions on Instrumentation and Measurement, vol. 39, no. 2, pp. 369-375, April 1990.

[32] Y. Liu, Y. Shi, J. Guo and Y. Wang, "Application of Pulse Compression Technique in Fault Detection and Localization of Leaky Coaxial Cable," IEEE Access, vol. 6, pp. 66709-66714, 2018.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A steering wheel, comprising:
   a frame;
   a foam layer; and
   a proximity sensor comprising a transceiver unit and a leaky coaxial cable operably coupled to the transceiver unit, wherein the leaky coaxial cable is embedded in and/or attached to at least one of the frame or the foam layer.

2. The steering wheel of claim 1, wherein the proximity sensor is configured to detect presence of a driver's hand.

3. The steering wheel of claim 2, wherein the proximity sensor is configured to detect a location of the driver's hand relative to the steering wheel.

4. The steering wheel of claim 1, wherein the proximity sensor further comprises a load operably coupled to the transceiver unit via the leaky coaxial cable.

5. The steering wheel of claim 1, wherein the leaky coaxial cable comprises at least one shielding layer having an opening formed therein, the opening in the at least one shielding layer allowing for energy leakage from the leaky coaxial cable.

6. The steering wheel of claim 1, wherein the leaky coaxial cable comprises:
   a conductive core;
   a dielectric layer surrounding the conductive core; and
   a conductive shielding layer surrounding the dielectric layer, wherein an opening is formed in the conductive shielding layer.

7. The steering wheel of claim 6, wherein the proximity sensor further comprises an outer sheath surrounding the conductive shielding layer, wherein the opening is formed in the outer sheath.

8. The steering wheel of claim 1, wherein the leaky coaxial cable comprises at least one shielding layer having a plurality of openings formed therein.

9. The steering wheel of claim 8, wherein the openings are spaced apart along an axially direction of the leaky coaxial cable.

10. The steering wheel of claim 1, wherein the proximity sensor further comprises a controller, the controller comprising a processing unit and a memory operably coupled to the processing unit, the memory having computer-executable instructions stored thereon that, when executed by the processing unit, cause the processing unit to:
    compare an input signal to a response signal; and
    detect an object in proximity to the leaky coaxial cable based on the comparison.

11. The steering wheel of claim 10, wherein the memory has further computer-executable instructions stored thereon that, when executed by the processing unit, cause the processing unit to periodically calibrate the proximity sensor.

12. The steering wheel of claim 10, wherein the transceiver unit is a modulated pulse transceiver unit.

13. The steering wheel of claim 12, wherein the modulated pulse transceiver unit is configured to:
  modulate the input signal using a carrier signal; and
  demodulate the response signal.

14. The steering wheel of claim 13, wherein the modulated pulse transceiver unit is further configured to:
  generate the input signal;
  transmit the modulated input signal via the leaky coaxial cable; and
  receive the response signal via the leaky coaxial cable.

15. The steering wheel of claim 13, wherein the carrier signal has a frequency of about 2.45 gigahertz (GHz).

16. The steering wheel of claim 1, wherein the transceiver unit comprises a rectifier and a filter, wherein the filter is configured to reduce or eliminate radiofrequency (RF) components of a reflected signal and the rectifier is configured to convert the reflected signal to a direct current (DC) component.

17. The steering wheel of claim 16, wherein the transceiver unit further comprises an analog-to-digital converter (ADC), wherein the ADC is configured to sample the DC component of the reflected signal.

18. The steering wheel of claim 1, wherein the transceiver unit is configured to transmit an input signal to the leaky coaxial cable and generate a direct current (DC) output signal from a reflected input signal.

19. The steering wheel of claim 18, wherein the input signal is a radiofrequency (RF) signal.

\* \* \* \* \*